(12) United States Patent
Fomenkov et al.

(10) Patent No.: US 7,291,853 B2
(45) Date of Patent: Nov. 6, 2007

(54) DISCHARGE PRODUCED PLASMA EUV LIGHT SOURCE

(75) Inventors: Igor V. Fomenkov, San Diego, CA (US); William N. Partlo, Poway, CA (US); Gerry M. Blumenstock, San Diego, CA (US); Nortbert Bowering, San Diego, CA (US); I. Roger Oliver, Wataupok (NZ); Xiaojiang Pan, San Diego, CA (US); Rodney D. Simmons, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 11/493,945

(22) Filed: Jul. 26, 2006

(65) Prior Publication Data

US 2007/0023711 A1 Feb. 1, 2007

Related U.S. Application Data

(60) Division of application No. 10/742,233, filed on Dec. 18, 2003, which is a continuation-in-part of application No. 10/409,254, filed on Apr. 8, 2003, now Pat. No. 6,972,421, which is a continuation-in-part of application No. 10/384,967, filed on Mar. 8, 2003, now Pat. No. 6,904,073, which is a continuation-in-part of application No. 10/189,824, filed on Jul. 3, 2002, now Pat. No. 6,815,700, which is a continuation-in-part of application No. 10/120,655, filed on Apr. 10, 2002, now Pat. No. 6,744,060, which is a continuation-in-part of application No. 09/875,719, filed on Jun. 6, 2001, now Pat. No. 6,586,757, which is a continuation-in-part of application No. 09/875,721, filed on Jun. 6, 2001, now Pat. No. 6,566,668, which is a continuation-in-part of application No. 09/690,084, filed on Oct. 16, 2000, now Pat. No. 6,566,667.

(60) Provisional application No. 60/422,808, filed on Oct. 31, 2002, provisional application No. 60/419,805, filed on Oct. 18, 2002.

(51) Int. Cl.
*H01J 65/04* (2006.01)

(52) U.S. Cl. .............................. 250/504 R; 250/505.1

(58) Field of Classification Search ............ 250/504 R, 250/492.2, 505.1
See application file for complete search history.

(56) References Cited

U.S. PATENT DOCUMENTS 2,759,106 A  8/1956  Wolter ......................... 250/53

(Continued)

FOREIGN PATENT DOCUMENTS

| TW | 447225 | 7/2001 |
| TW | 460972 | 10/2001 |
| WO | WO2004081503 A2 | 9/2004 |

OTHER PUBLICATIONS

U.S. Appl. No. 60/419,805, filed Jan. 18, 2002, Ness et al.

(Continued)

*Primary Examiner*—Kiet T. Nguyen
(74) *Attorney, Agent, or Firm*—William Cray

(57) ABSTRACT

An DPP EUV source is disclosed which may comprise a debris mitigation apparatus employing a metal halogen gas producing a metal halide from debris exiting the plasma. The EUV source may have a debris shield that may comprise a plurality of curvilinear shield members having inner and outer surfaces connected by light passages aligned to a focal point, which shield members may be alternated with open spaces between them and may have surfaces that form a circle in one axis or rotation and an ellipse in another. The source may have a temperature control mechanism operatively connected to the collector and operative to regulate the temperature of the respective shell members to maintain a temperature related geometry optimizing the glancing angle of incidence reflections from the respective shell members, or a mechanical positioner to position the shell members.

6 Claims, 18 Drawing Sheets

U.S. PATENT DOCUMENTS

| | | | |
|---|---|---|---|
| 3,150,483 A | 9/1964 | Mayfield et al. ............. 60/35.5 |
| 3,232,046 A | 2/1966 | Meyer ........................ 50/35.5 |
| 3,279,176 A | 10/1966 | Boden ........................ 60/202 |
| 3,746,870 A | 7/1973 | Demarest .................... 250/227 |
| 3,960,473 A | 6/1976 | Harris ........................ 425/467 |
| 3,961,197 A | 6/1976 | Dawson ..................... 250/493 |
| 3,969,628 A | 7/1976 | Roberts et al. ............. 250/402 |
| 4,042,848 A | 8/1977 | Lee .......................... 313/231.6 |
| 4,088,966 A | 5/1978 | Samis ..................... 313/231.5 |
| 4,143,275 A | 3/1979 | Mallozzi et al. ............ 250/503 |
| 4,162,160 A | 7/1979 | Witter ........................ 75/246 |
| 4,203,393 A | 5/1980 | Giardini ...................... 123/30 |
| 4,223,279 A | 9/1980 | Bradford, Jr. et al. ..... 331/94.5 |
| 4,364,342 A | 12/1982 | Asik .......................... 123/143 |
| 4,369,758 A | 1/1983 | Endo .......................... 123/620 |
| 4,455,658 A | 6/1984 | Sutter, Jr. ................... 372/38 |
| 4,504,964 A | 3/1985 | Cartz et al. ................. 378/119 |
| 4,507,588 A | 3/1985 | Asmussen et al. ........... 315/39 |
| 4,536,884 A | 8/1985 | Weiss et al. ................ 378/119 |
| 4,538,291 A | 8/1985 | Iwamatsu ................... 378/119 |
| 4,561,406 A | 12/1985 | Ward .......................... 123/536 |
| 4,596,030 A | 6/1986 | Herziger et al. ............ 378/119 |
| 4,618,971 A | 10/1986 | Weiss et al. ................. 378/34 |
| 4,626,193 A | 12/1986 | Gann .......................... 431/71 |
| 4,633,492 A | 12/1986 | Weiss et al. ................ 378/119 |
| 4,635,282 A | 1/1987 | Okada et al. ................ 378/34 |
| 4,644,576 A | 2/1987 | Kuyel ........................ 378/119 |
| 4,751,723 A | 6/1988 | Gupta et al. ................ 378/119 |
| 4,752,946 A | 6/1988 | Gupta et al. ................ 378/119 |
| 4,774,914 A | 10/1988 | Ward .......................... 123/162 |
| 4,837,794 A | 6/1989 | Riordan et al. ............. 378/119 |
| 4,928,020 A | 5/1990 | Birx et al. ................... 307/106 |
| 4,959,840 A | 9/1990 | Akins et al. ................. 372/57 |
| 5,023,884 A | 6/1991 | Akins et al. ................. 372/57 |
| 5,023,897 A | 6/1991 | Neff et al. ................... 378/122 |
| 5,025,445 A | 6/1991 | Anderson et al. ............ 372/20 |
| 5,025,446 A | 6/1991 | Kuizenga .................... 372/21 |
| 5,027,076 A | 6/1991 | Horsley et al. ............. 324/674 |
| 5,102,776 A | 4/1992 | Hammer et al. ............ 430/311 |
| 5,126,638 A | 6/1992 | Dethlefsen ................. 315/326 |
| 5,142,166 A | 8/1992 | Birx ........................... 307/419 |
| 5,175,755 A | 12/1992 | Kumakhov ................. 378/34 |
| 5,189,678 A | 2/1993 | Ball et al. ................... 372/28 |
| 5,241,244 A | 8/1993 | Cirri ........................ 315/111.4 |
| 5,243,638 A | 9/1993 | Wang et al. ................ 378/119 |
| 5,313,481 A | 5/1994 | Cook et al. .................. 372/37 |
| 5,315,611 A | 5/1994 | Ball et al. ................... 372/57 |
| 5,359,620 A | 10/1994 | Akins .......................... 372/58 |
| 5,411,224 A | 5/1995 | Dearman et al. ............ 244/53 |
| 5,442,910 A | 8/1995 | Anderson ................... 60/266 |
| 5,448,580 A | 9/1995 | Birx et al. ................... 372/38 |
| 5,471,965 A | 12/1995 | Kapich ...................... 123/565 |
| 5,499,282 A | 3/1996 | Silfvast ...................... 378/119 |
| 5,504,795 A | 4/1996 | McGeoch ................... 378/119 |
| 5,729,562 A | 3/1998 | Birx et al. ................... 372/38 |
| 5,763,930 A | 6/1998 | Partlo ........................ 250/504 |
| 5,768,339 A | 6/1998 | O'Hara ....................... 378/147 |
| 5,771,258 A | 6/1998 | Morton et al. ............... 372/57 |
| 5,852,621 A | 12/1998 | Sandstrom .................. 372/25 |
| 5,863,017 A | 1/1999 | Larson et al. ............ 248/176.1 |
| 5,866,871 A | 2/1999 | Birx .......................... 219/121 |
| 5,936,988 A | 8/1999 | Partlo et al. ................ 372/38 |
| 5,953,360 A | 9/1999 | Vitruk et al. ................ 372/87 |
| 5,963,616 A | 10/1999 | Silfvast et al. ............. 378/122 |
| 5,978,394 A | 11/1999 | Newman et al. ............. 372/32 |
| 5,982,800 A | 11/1999 | Ishihara et al. .............. 372/57 |
| 5,991,324 A | 11/1999 | Knowles et al. ............. 372/57 |
| 6,005,879 A | 12/1999 | Sandstrom et al. ........... 372/25 |
| 6,014,398 A | 1/2000 | Hofmann et al. ............ 372/60 |
| 6,016,325 A | 1/2000 | Ness et al. ................... 372/38 |
| 6,018,537 A | 1/2000 | Hofmann et al. ............ 372/25 |
| 6,028,880 A | 2/2000 | Carlesi et al. ................ 372/58 |
| 6,031,241 A | 2/2000 | Silfvast et al. .............. 250/504 |
| 6,039,850 A | 3/2000 | Schulz ..................... 204/192.15 |
| 6,051,841 A | 4/2000 | Partlo ........................ 250/504 |
| 6,064,072 A | 5/2000 | Partlo et al. ................ 250/504 |
| 6,067,311 A | 5/2000 | Morton et al. ................ 372/57 |
| 6,094,448 A | 7/2000 | Fomenkov et al. ......... 372/102 |
| 6,104,735 A | 8/2000 | Webb ........................... 372/37 |
| 6,108,397 A | 8/2000 | Cash, Jr. ..................... 378/34 |
| 6,109,574 A | 8/2000 | Pan et al. ................. 248/176.1 |
| 6,128,323 A | 10/2000 | Myers et al. ................. 372/38 |
| 6,151,349 A | 11/2000 | Gong et al. .................. 372/58 |
| 6,164,116 A | 12/2000 | Rice et al. .................... 73/1.72 |
| 6,172,324 B1 | 1/2001 | Birx ....................... 219/121.57 |
| 6,188,710 B1 | 2/2001 | Besaucele et al. ............ 372/60 |
| 6,192,064 B1 | 2/2001 | Algots et al. ................. 372/99 |
| 6,195,272 B1 | 2/2001 | Pascente ...................... 363/21 |
| 6,208,674 B1 | 3/2001 | Webb et al. .................. 372/57 |
| 6,208,675 B1 | 3/2001 | Webb .......................... 372/58 |
| 6,212,211 B1 | 4/2001 | Azzola et al. ................ 372/33 |
| 6,219,368 B1 | 4/2001 | Govorkov .................... 372/59 |
| 6,232,613 B1 | 5/2001 | Silfvast et al. .............. 250/504 |
| 6,240,117 B1 | 5/2001 | Gong et al. .................. 372/58 |
| 6,317,447 B1 | 11/2001 | Partlo et al. .................. 372/57 |
| 6,330,261 B1 | 12/2001 | Ishihara et al. ............. 372/38.1 |
| 6,359,922 B1 | 3/2002 | Partlo et al. .................. 372/58 |
| 6,414,979 B2 | 7/2002 | Ujazdowski et al. .......... 372/87 |
| 6,452,199 B1 | 9/2002 | Partlo et al. ................ 250/504 |
| 6,466,365 B1 | 10/2002 | Maier et al. ................. 359/355 |
| 6,477,193 B2 | 11/2002 | Oliver et al. ................. 372/58 |
| 6,566,667 B1 | 5/2003 | Partlo et al. ................ 250/504 |
| 6,566,668 B2 | 5/2003 | Rauch et al. ............... 250/504 |
| 6,567,499 B2 | 5/2003 | McGeoch ................... 378/119 |
| 6,576,912 B2 | 6/2003 | Visser et al. ............. 250/492.2 |
| 6,586,757 B2 | 7/2003 | Melnychuk et al. ........ 250/504 |
| 6,590,959 B2 | 7/2003 | Kandaka et al. ............ 378/119 |
| 6,744,060 B2 | 6/2004 | Ness et al. .................. 250/504 |
| 6,757,316 B2 | 6/2004 | Newman et al. ............. 372/57 |
| 6,795,474 B2 | 9/2004 | Partlo et al. .................. 372/57 |
| 6,804,327 B2 | 10/2004 | Schriever et al. ........... 378/119 |
| 6,815,700 B2 | 11/2004 | Melnychuk et al. ........ 250/504 |
| 6,894,298 B2 | 5/2005 | Ahmad et al. .............. 250/504 |
| 6,904,073 B2 | 6/2005 | Yager et al. .................. 372/57 |
| 7,015,489 B2 * | 3/2006 | Singer et al. ............ 250/504 R |

OTHER PUBLICATIONS

U.S. Appl. No. 60/422,808, filed Oct. 31, 2002, Partlo et al.

Apruzese, J.P., "X-Ray Laser Research Using Z Pinches," *Am. Inst. of Phys.* 399-403, (1994).

Bailey, et al., "Evaluation Of The Gas Puff Z Pinch As An X-Ray Lithography And Microscopy Source", *Appl. Phys. Lett.*, 40 (1), pp. 33-35 (Jan. 1, 1982).

Burnett, et al., "Symmetry Of Spatial-Dispersion-Induced Birefringence And Its Implication For $CaF_2$ Ultraviolet Optics", *JM*, vol. 1 (3), (Oct. 2002).

Bollanti, et al., "Compact Three Electrodes Excimer Laser IANUS for a POPA Optical System," *SPIE Proc.* (2206)144-153, (1994).

Bollanti, et al., "Ianus, the three-electrode excimer laser," *App. Phys. B (Lasers & Optics)* 66(4):401-406, (1998).

Choi, et al., "A $10^{13}$ A/s High Engery Density Micro Discharge Radiation Source," *B. Radiation Characteristics*, p. 287-290.

Choi, et al., "Fast pulsed hollow cathode capillary discharge device," *Rev. of Sci. Instrum.* 69(9):3118-3122 (1998).

Choi, et al., "Temporal Development Of Hard And Soft X-Ray Emission From A Gas-Puff Z Pinch", *Rev. Sci. Instrum.* 57(8),pp. 2162-2164 (Aug. 1986).

Fomenkov, et al., "Characterization of a 13.5nm Source for EUV Lithography based on Dense Plasma Focus and Lithium Emission," Sematech Intl. Workshop on EUV Lithography (Oct. 1999).

Georgescu, et al., "A Pspice Simulation Of A Plasma-Focus Device Driven By A Magnetic Pulse Compression Circuit", *Pulse Power '96*, IEE Colloquium, pp. 32/1-32/1 (1996).

Giordano, et al., "Magnetic Pulse Compressor For Prepulse Discharge In Spiker-Sustainer Excitati Technique For XeC1 Lasers," *Rev. Sci. Instrum* 65(8),pp. 2475-2481 (Aug. 1994).

Hansson, et al., "Xenon liquid jet laser-plasma source for EUV lithography," Emerging Lithographic Technologies IV, *Proc. Of SPIE.* vol. 3997:729-732 (2000).

Jahn, *Physics of Electric Propulsion*, McGraw-Hill Book Company, (Series in Missile and Space USA), Chap. 9 "Unsteady Electromagnetic Acceleration", p. 257 (1986).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," *Am. Vac. Sci. Techn. B.*, 6(1): 195-198 (1988).

Lebert, et al., "Soft x-ray emission of laser-produced plasmas using a low-debris cryogenic nitrogen target," *J. App. Phys.*, 84(6):3419-3421 (1998).

Lebert, et al., "A gas discharge based radiation source for EUV-lithography," Intl. Conf. Micro and Nano-Engineering 98 (Sep. 22-24, 1998) Leuven, Belgium.

Lebert, et al., "Investigation of pinch plasmas with plasma parameters promising ASE," Inst. Phys. Conf. Ser No. 125: Section 9, pp. 411-415 (1992) Schiersee, Germany.

Lebert, et al., "Comparison of laser produced and gas discharge based EUV sources for different applications," Intl. Conf. Micro- and Nano-Engineering 98 (Sep. 22-24, 1998) Leuven, Belgium.

Lee, Ja H., "Production of dense plasmas in hypocyloidal pinch apparatus," *The Phys. Of Fluids*, 20(2):313-321 (1977).

Lewis, Ciaran L.S., "Status of Collision-Pumped X-ray Lasers," *Am Inst. Phys.* pp. 9-16 (1994).

Lowe, "Gas Plasmas Yield X-Rays For Lithography", *Electronics*, pp. 40-41 (Jan. 27, 1982).

Malmqvist, et al., "Liquid-jet target for laser-plasma soft x-ray generation," *Am. Inst. Phys.* 67(12):4150-4153 1996).

Mather, et al., "Stability of the Dense Plasma Focus," *Phys. Of Fluids*, 12(11):2343-2347 (1969).

Mather, "Formation Of A High-Density Deuterium Plasma Focus," *The Physics of Fluids*, 8 (2), 366-377 (Feb. 1965).

Matthews et al, "Plasma Sources For X-Ray Lithography", *SPIE*, 333 Submicron Lithography, pp. 136-139 (1982).

Mayo, et al., "A magnetized coaxial source facility for the generation of energetic plasma flows," *Sci. Technol.* vol. 4:pp. 47-55 (1994).

Mayo, et al., "Initial Results on high enthalpy plasma generation in a magnetized coaxial source," *Fusion Tech* vol. 26:1221-1225 (1994).

Nilsen, et al., "Analysis of resonntly photopumped Na-Ne x-ray-laser scheme," *Am Phys. Soc.* 44(7):4591-4597 (1991).

Partlo, et al., "EUV (13.5nm) Light Generation Using a Dense Plasma Focus Device," *SPIE Proc. On Emerging Lithographic Technologies III*, vol. 3676, 846-858 (Mar. 1999).

Pearlman et al., "X-Ray Lithography Using A Pulsed Plasma Source", *J. Vac. Sci. Technol.*, pp. 1190-1193 (Nov./Dec. 1981).

Porter, et al., "Demonstration of Population Inversion by Resonant Photopumping in a Neon Gas Cell Irradiated by a Sodium Z Pinch," *Phys. Rev. Let.*, 68(6):796-799, (Feb. 1992).

Price, Robert H., "X-Ray Microscopy using Grazing Incidence Reflection Optics," *Am. Inst. Phys.*, pp. 189-199, (1981).

Qi, et al., "Fluorescence in Mg IX emission at 48.340 Å from Mg pinch plasmas photopumped by Al XI line radiation at 48.338 Å," *The Am. Phys. Soc.*, 47(3):2253-2263 (Mar. 1993).

Scheuer, et al., "A Magnetically-Nozzled, Quasi-Steady, Multimegawatt, Coaxial Plasma Thruster," *IEEE: Transactions on Plasma Science*, 22(6) (Dec. 1994).

Schriever, et al., "Laser-produced lithium plasma as a narrow-band extended ultraviolet radiation source for photoelectron spectroscopy," *App. Optics*, 37(7):1243-1248, (Mar. 1998).

Schriever, et al., "Narrowband laser produced extreme ultraviolet sources adapted to silicon/molybdenum multilayer optics," *J. of App. Phys.*, 83(9):4566-4571, (May 1998).

Shiloh, et al., "Z Pinch Of A Gas Jet", *Physical Review Lett.*, 40 (8), pp. 515-518 (Feb. 20, 1978).

Silfvast, et al., "High-power plasma discharge source at 13.5 nm and 11.4 nm for EUV lithography," *SPIE*, vol. 3676:272-275, (Mar. 1999).

Silfvast, et al., "Lithium hydride capillary discharge creates x-ray plasma at 13.5 namometers," *Laser Focus World*, p. 13. (Mar. 1997).

Stallings, et al., "Imploding Argon Plasma Experiments", *Appl. Phys. Lett.*, 35 (7), pp. 524-526 (Oct. 1, 1979).

Wilhein, et al., "A slit grating spectrograph for quantitative soft x-ray spectroscopy," *Am. Inst. Of Phys. Rev. of Sci Instrum* 70(3):1694-1699 (Mar. 1999).

Wu, et al., "The vacuum Spark and Spherical Pinch X-ray/EUV Point Sources," *SPIE, Conf. On Emerging Tech. III*, Santa Clara, CA, vol. 3676:410-420, (Mar. 1999).

Zombeck, M.V., "Astrophysical Observations with High Resolution X-ray Telescope," *Am. Inst. Of Phys.*, pp. 200-209 (1981).

\* cited by examiner

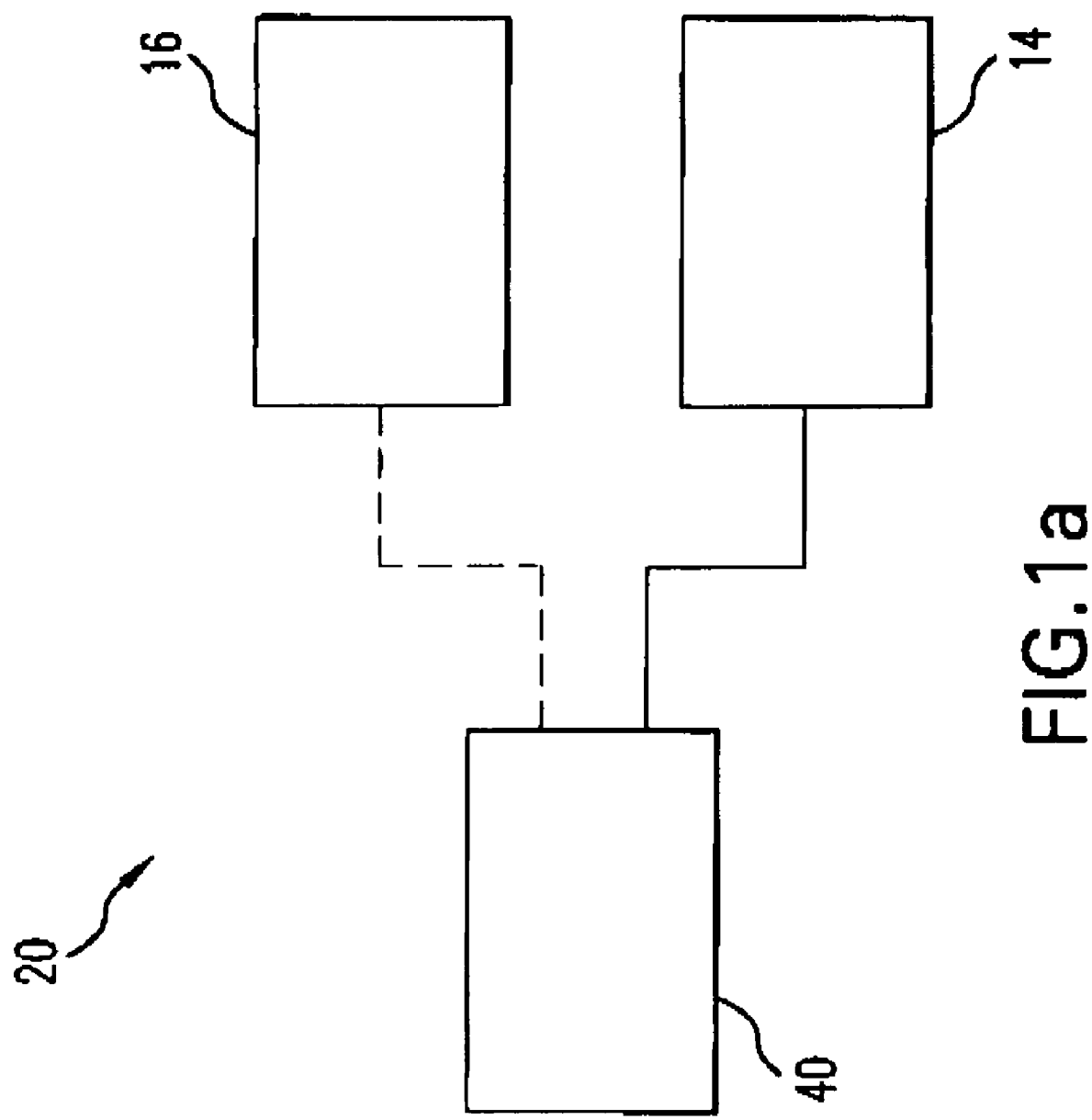

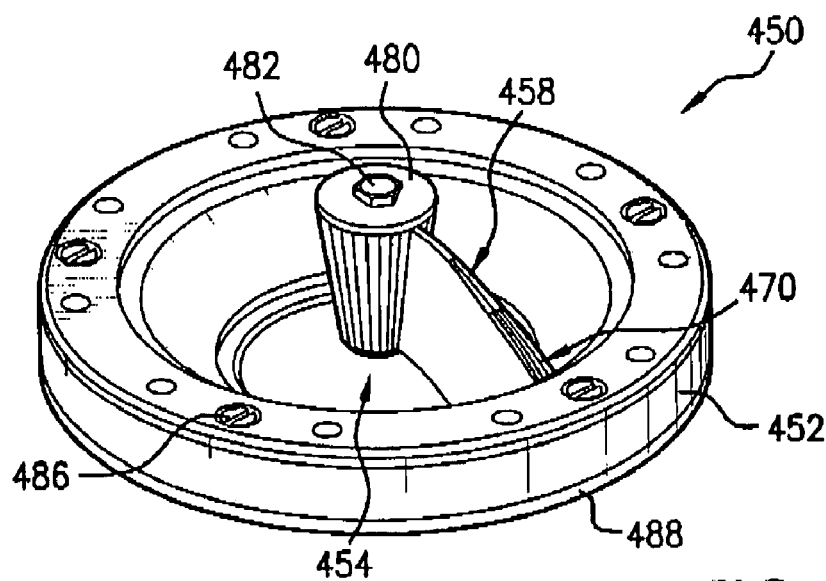
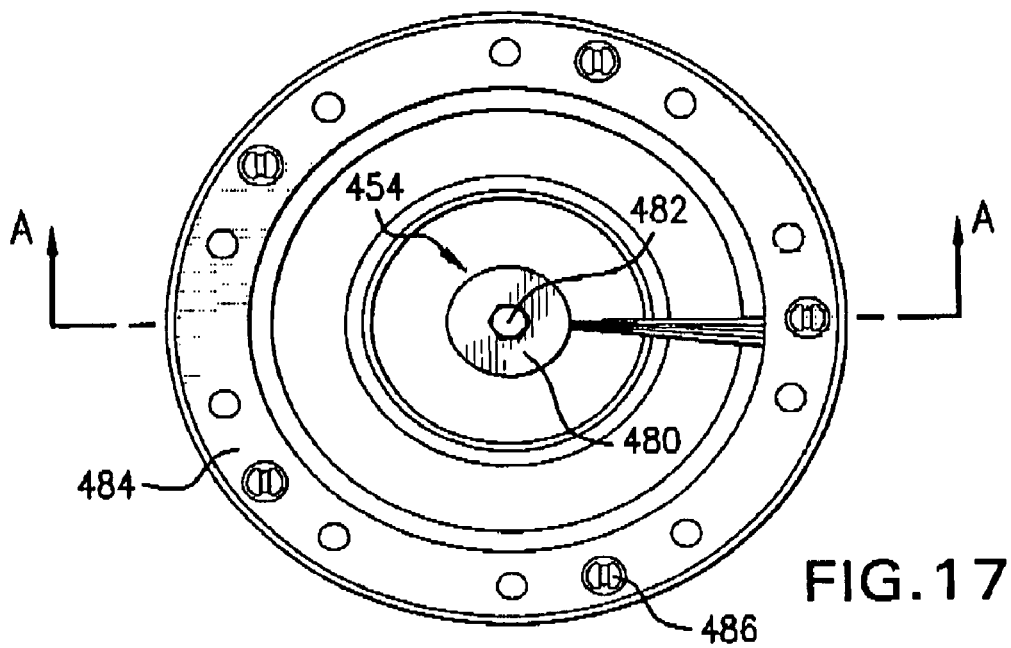
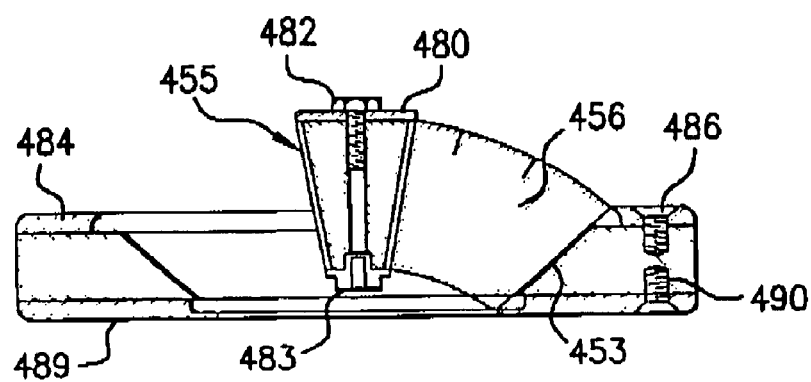
FIG.17a
FIG.17b
FIG.17c

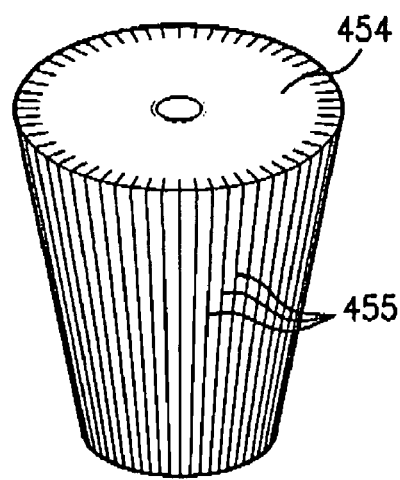
FIG.17d
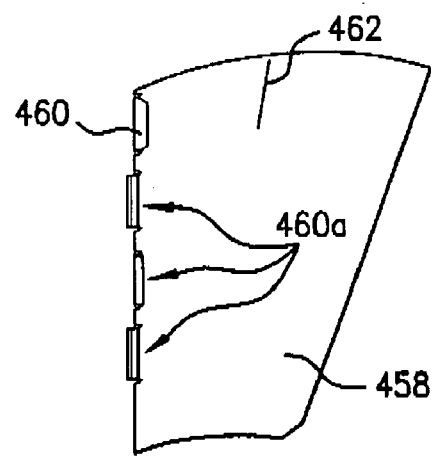
FIG.17e
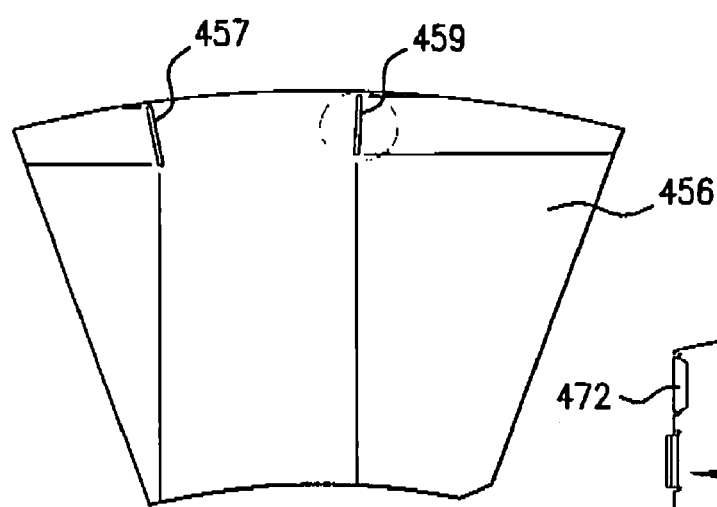
FIG.17f
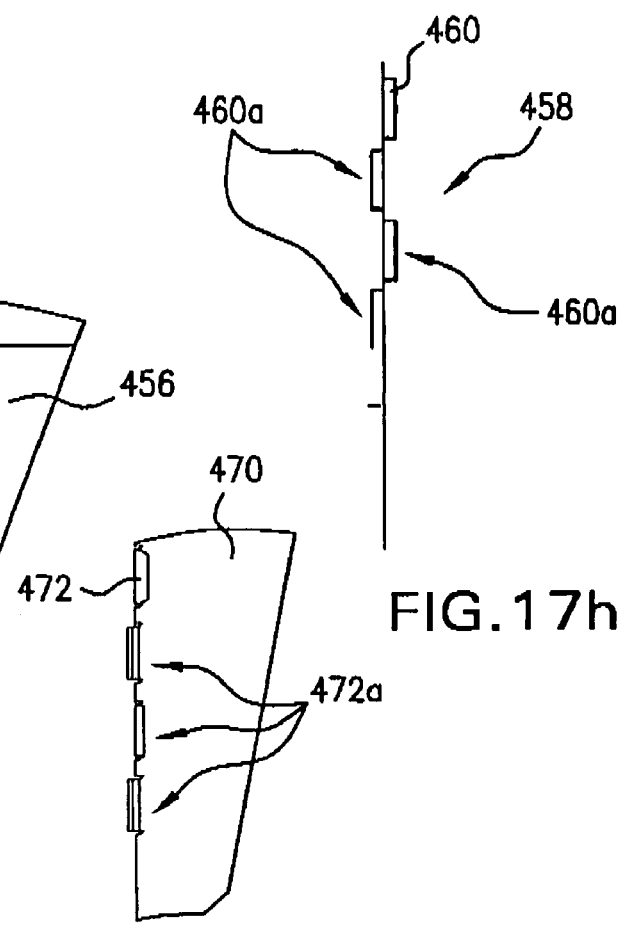
FIG.17h
FIG.17g

DISCHARGE PRODUCED PLASMA EUV LIGHT SOURCE

RELATED APPLICATIONS

This application is a divisional of U.S. Ser. No. 10/742,233 filed Dec. 18, 2003, which is a continuation-in-part of U.S. Ser. No. 10/409,254 filed Apr. 8, 2003, now U.S. Pat. No. 6,972,421, which is a continuation-in-part of U.S. Ser. No. 10/384,967 filed Mar. 8, 2003, now U.S. Pat. No. 6,904,073, U.S. Ser. No. 10/189,824 filed Jul. 3, 2002, now U.S. Pat. No. 6,815,700, U.S. Ser. No. 10/120,655 filed Apr. 10, 2002, now U.S. Pat. No. 6,744,060, U.S. Ser. No. 09/875,719 filed Jun. 6, 2001 now U.S. Pat. No. 6,586,757 and U.S. Ser. No. 09/875,721 filed Jun. 6, 2001, now U.S. Pat. No. 6,566,668, U.S. Ser. No. 09/690,084 filed Oct. 16, 2000, now U.S. Pat. No. 6,566,667; and claims the benefit of patent application Ser. Nos. 60/422,808 filed Oct. 31, 2002 and 60/419,805 filed Oct. 18, 2002; all of which is incorporated by reference herein.

FIELD OF THE INVENTION

The present invention relates to EUV and soft-x-ray light sources utilizing a discharge between electrodes to form the light emitting plasma.

BACKGROUND OF THE INVENTION

It is well known to produce extreme ultraviolet ("EUV") light from plasmas created, e.g., by applying a high voltage across electrodes to produce a discharge, e.g., in a gas medium, e.g., containing an active material, e.g., Xenon, to produce light at EUV wavelengths, e.g., for xenon at 13.5 nm (also referred to as soft-x-ray). Such EUV light sources are commonly referred to as discharge produced plasma ("DPP") EUV (soft-x-ray) light sources.

U.S. Pat. No. 5,763,930, issued to Partlo on Jun. 9, 1998, U.S. Pat. No. 6,051,841, issued to Partlo on Apr. 18, 2000, U.S. Pat. No. 6,064,072, issued to Partlo et al. on May 16, 2000, U.S. Pat. No. 6,452,199, issued to Partlo et al. on Sep. 17, 2002, U.S. Pat. No. 6,541,786, issued to Partlo on Apr. 1, 2003, and U.S. Pat. No. 6,586,757, issued to Melnychuck et al. on Jul. 1, 2003, along with pending U.S. applications Ser. Nos. 09/752,818, 10/120,655, entitled PULSE POWER SYSTEM FOR EXTREME ULTRAVIOLET AND X-RAY LIGHT, filed on Apr. 10, 2002, with inventors Ness et al., Published on Nov. 7, 2002, Pub. No. US/2002-0163313-A1, Ser. No. 10/189,824, filed on Jul. 3, 2002, entitled PLASMA FOCUS LIGHT SOURCE WITH IMPROVED PULSE POWER SYSTEM, with inventors Melnychuk et al., published on Jan. 9, 2003, Publication No. US/2003-0006383-A1, Ser. No. 10/384,967, filed on Mar. 8, 2003, entitled HIGH POWER DEEP ULTRAVIOLET LASER WITH LONG LIFE OPTICS, with inventors Yager, et al., Ser. No. 10/409,254, filed on Apr. 8, 2003, entitled EXTREME ULTRAVIOLET LIGHT SOURCE, with inventors Melnychuk et al. all discuss aspects of EUV light sources particularly utilizing DPP to create the plasma producing the light, and the disclosures of each of these are hereby incorporated by reference.

Current EUV collection optics consist, e.g., of several nested shells with common focal points, e.g., at some common ambient temperature. Typically these shells are formed, e.g., from nickel, and feature relatively thin walls, e.g., approximately 1 mm thick. A consequence of EUV light generation is high thermal loads on components close to the EUV source point. In the case of optical components, these thermal loads can, e.g., distort critical surfaces shifting focal points.

A very efficient manner for transmitting EUV light is, e.g., via "glancing angle of incidence" reflectors. Typically the nested collector shells will feature, e.g., at least two distinct reflecting surfaces, e.g., flat or curved surfaces, enabling light emitted at large angles from a discharge produced plasma to be collected and delivered to an intermediate focal point or plane at a relatively small angle, i.e., numerical aperture.

Avoiding distortions and maintaining focus plane or point is an aspect of EUV light source design that can use some improvement.

Electrode lifetime is another EUV light source issue that needs attention. Electrode lifetimes of 100M shots at a 10% output degradation are believed to be minimum requirements for a DPP EUV system. Current technology allows for more on the order of less than 30M shots with around the noted degradation. A byproduct of EUV light emission by means of a DPP produced pinched plasma is high thermal loads on the structures and elements in close proximity to the pinch formation. This can lead to several detrimental effects on performance and on component life, e.g., in the case of the central electrode, thermal loads may be so severe that the outer surface of the electrode could excessively erode, e.g., through material vaporization. Erosion eventually forces replacement of the electrode for a number of reasons, including effects on the plasma formation and inability to withstand the pressure of cooling water circulating in the interior of the electrode structure.

At this time, EUV electrode lifetimes are an order of magnitude away from lifetime figures quoted by the lithography industry. As such, replacement costs and machine downtime during electrode replacement constitute a large portion of "cost of ownership" for DPP EUV sources.

SiC—BN is known to be used in the defense industry as armor plating. SiC doping with BN is common for SiC-graphite systems, e.g., coated fibers with BN. TiW is known to be used for contacts in the semiconductor industry and is a common machined material, e.g., for PVD targets.

Another important consideration for DPP EUV light sources is the need to substantially decrease deleterious effects of electrode debris, arising from a discharge produced plasma EUV light source, impinging upon system optics, e.g., the collector optical elements.

Another important aspect of DPP EUV light sources is the need to make the most efficient use possible of the energy injected into the DPP apparatus, in order to maximize the light output for a given energy input. Very high energy light output is required and there are limits, e.g., on the ability to deliver very high energy pulses to the discharge electrodes at the required repetition rates, e.g., due to timing and heat dissipation requirements.

SUMMARY OF THE INVENTION

A DPP EUV source is disclosed which may comprise a debris mitigation apparatus employing a metal halogen gas producing a metal halide from debris exiting the plasma. The EUV source may have a debris shield that may comprise a plurality of curvilinear shield members having inner and outer surfaces connected by light passages aligned to a focal point, which shield members may be alternated with open spaces between them and may have surfaces that form a circle in one axis of rotation and an ellipse in another. The electrodes may be supplied with a discharge pulse shaped to produce a modest current during the axial run out phase of the discharge and a peak occurring during the radial compression phase of the discharge. The light source may comprise a turbomolecular pump having an inlet connected to the generation chamber and operable to preferentially pump more of the source gas than the buffer gas from the chamber. The source may comprise a tuned electrically conductive electrode comprising: a differentially doped ceramic material doped in a first region to at least select electrical conductivity and in a second region at least to select thermal conductivity. The first region may be at or near the outer surface of the electrode structure and the ceramic material may be SiC or alumina and the dopant is BN or a metal oxide, including SiO or $TiO_2$. The source may comprise a moveable electrode assembly mount operative to move the electrode assembly mount from a replacement position to an operating position, with the moveable mount on a bellows. The source may have a temperature control mechanism operatively connected to the collector and operative to regulate the temperature of the respective shell members to maintain a temperature related geometry optimizing the glancing angle of incidence reflections from the respective shell members, or a mechanical positioner to position the shell members. The shells may be biased with a voltage. The debris shield may be fabricated using off focus laser radiation. The anode may be cooled with a hollow interior defining two coolant passages or porous metal defining the passages. The debris shield may be formed of pluralities of large, intermediate and small fins attached either to a mounting ring or hub or to each other with interlocking tabs that provide uniform separation and strengthening and do not block any significant amount of light.

BRIEF DESCRIPTION OF THE DRAWINGS

FIGS. 1 and 1A show a schematic view of a discharge-produced plasma EUV (soft-x-ray) light source and the major components of an embodiment of such a system;

FIGS. 17A-H sow another debris shield according to an embodiment of the present invention; and, FIGS. 18A and 18B show simulations of the generation of a plasma pinch according to aspects of an embodiment of the present invention.

DETAILED DESCRIPTION OF PREFERRED EMBODIMENTS

Figure 1:
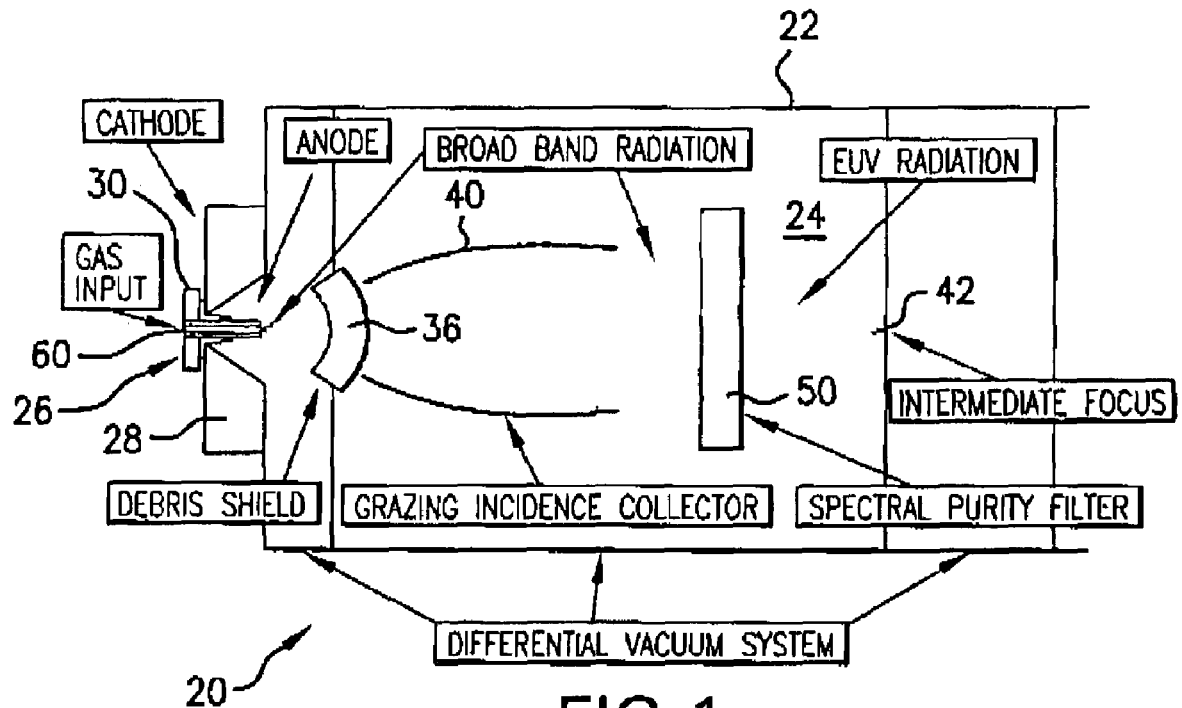
Figure 2:
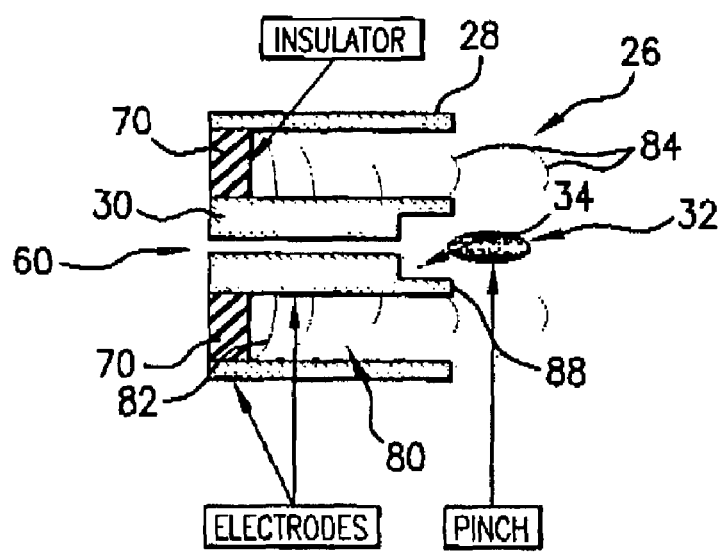
FIG. 2 shows a schematic view of an embodiment of an electrode for DPP EUV light production.

Turning now to FIGS. 1 and 1A there is shown a discharge produced plasma ("DPP") EUV and soft-x-ray light source 20 according to an embodiment of the present invention. The EUV light source may include, e.g., a housing 22, defining a discharge chamber 24. Attached, e.g., through a sealed opening in one wall of the chamber 22 may be, e.g., a pair of electrodes 26, which may include, e.g., generally cylindrical electrodes including, e.g., an outer electrode 28, which may be, e.g., the cathode, and an inner electrode 30, which may be, e.g., an anode or vice-versa, but for purposes of this disclosure the former designations wilt be used. The inner electrode 30 may be insulated from the outer electrode 28, e.g., by an insulator 70 as shown in FIG. 2, and together, when supplied by a very high voltage and with a very fast rise time pulse of electrical energy, e.g., from a solid stair pulse power module 139, shown in FIG. 7, produce a discharge between the electrodes 28, 30, e.g., through an ionized gas, e.g., comprising helium. The discharge may be facilitated in its initiation by a preionizer 206, e.g., as shown in FIGS. 10-12c. The discharge may, e.g., initially form a magnetic field that extends generally radially from the inner electrode near the insulator 70 and preionizer 206 as shown at 82 in FIG. 2 and then extend more axially as it transmits along the outer surface 208 of the inner electrode (anode) 30, as shown schematically at 84 in FIG. 2. The axially extending magnetic field 84, forms a high density plasma pinch 32 confined briefly by the magnetic field 84 comprising a source material, e.g., xenon, e.g., delivered to the pinch site through a source delivery tube 60 and, e.g., delivered into a center electrode (anode) tip depression 34 in the tip of the center electrode 30.

Light emitted from the plasma pinch may, e.g., be collected by, e.g., a grazing angle of incidence collector 40 after passing through, e.g., a debris shield 36 that can, e.g., trap debris, e.g., ionized xenon particles emitted from the plasma during the light generation process or electrode material, e.g., tungsten debris from the electrodes, and potentially damaging, e.g., to the reflecting surface(s) in the collector 40. The light focused by the collector 40, which may be, e.g., a single curved surface reflecting rays of the EUV light by grazing angle of incidence reflection to a focal point or plane called the intermediate focus 42, may also pass through, e.g., a spectral purity filter operative to filter out substantially all of the light except at, e.g., 13.5 nm and a relatively narrow bandwidth around 13.5 nm.

An aspect of an embodiment of the present invention contemplates compensating for thermal loads on the collector 40 in order to produce more consistent high EUV energy delivered to the intermediate focus 42.

Figure 3:
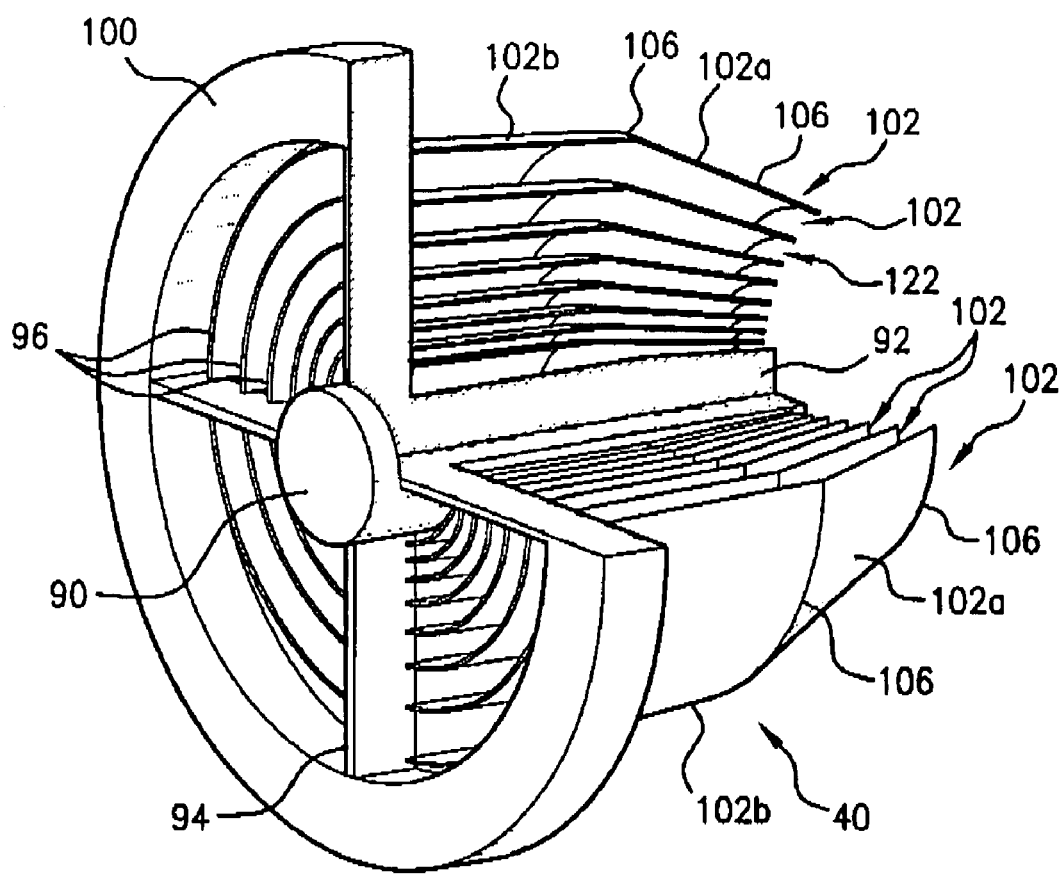
FIG. 3 shows an embodiment of a collector system for an EUV light source, adapted to, e.g., collect the light in a cone of emission from a light producing plasma.
Figure 4:
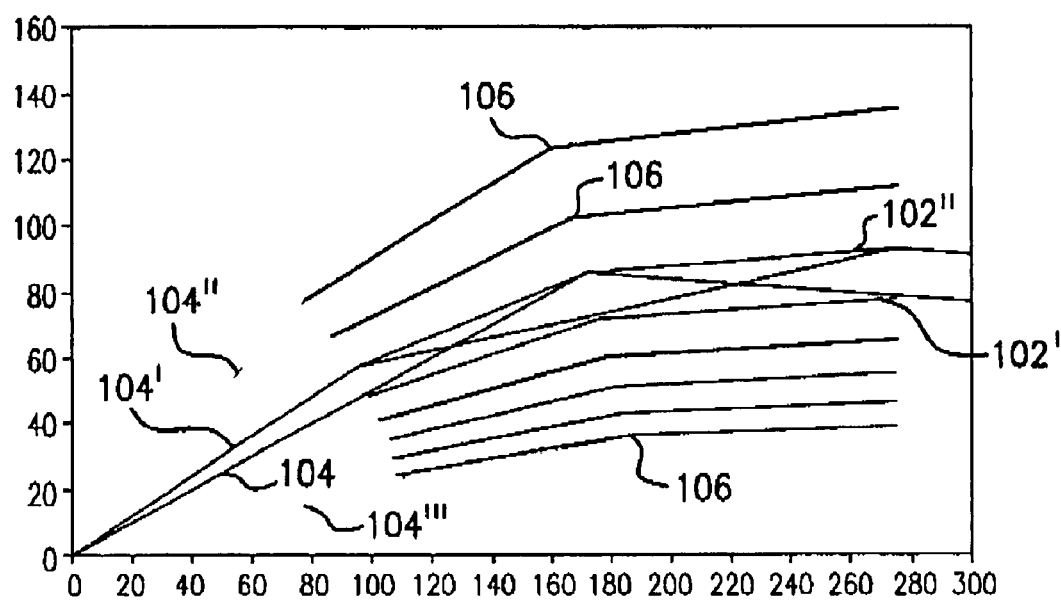
FIG. 4 shows a schematic cross-sectional view of the grazing angle of incidence operation of the embodiment of a collector shown in FIG. 3.

Turning now to FIGS. 3 and 4 there is shown a perspective cut-away view of a collector 40 according to an embodiment of the present invention, and also a schematic view of an example of the operation of the collector 40 according to an embodiment of the present invention. As can be seen in FIG. 4, a ray tracing of some exemplary limiting rays, each of the shells 102 of the collector 40, having a first shell portion 102*a* and a second shell portion 102*b*, has a limiting ray 104 and a limiting ray 104' and is arranged to reflect the limiting rays 104, 104' at a grazing angle of incidence from portion 102*a* to portion 102*b*, each of which portions 102*a*, 102*b* could be flat or curved. At portion 102*b* the grazing angle of incidence reflection will focus the light in rays 104, 104' toward the intermediate focus 42. For purposes of this application, the light may be broadband and need to pass through a filter of some sort, e.g., the spectral purity filter 50 shown in FIG. 1. As can be seen from FIG. 4, there is very little real estate, i.e., physical space, available to bolster the thickness of individual shells 102, including their component parts 102*a*, 102*b*. To do so, would impede the transmission of the adjacent, e.g., next outer shell. Modifying shell geometry to allow thicker walls increases the respective glancing angles, thereby reducing transmission efficiency of the design. Some rays of light 104" and 104'" for example, do not enter the cone of entrance of the collector 40, or do not do so at an appropriate grazing angle of incidence, usually less that about 2°, depending on the wavelength λ of the emitted light and the material of the reflecting surface, and are, therefore, not collected by the collector.

The collector 40, as shown in FIG. 3 can be composed of a plurality of nested shells 102, each smaller in diameter than the other from outside in. The shells may be made up of a plurality of portions, e.g., two portions 102*a* and 102*b*, with portion 102*a* closest to the pinch site 32. Each shell 102 portion 102*a* may, e.g., be angled to reflect the light rays in a portion of the cone of incidence of the plasma generated light that is incident on the collector 40 shells 102 and to reflect that light to the portion 102*b*. At the portion 102*b* a further grazing angle of incidence reflection can occur, which can, e.g., reflect the incident EUV light at an angle focused at the intermediate focus 42.

The shells 102 can, e.g., be mounted to a collector hub 90 which may have, e.g., collector hub extensions 92 extending from the hub 90 along the axial length of the collector 40. Also attached to the hub 90 may be a plurality, e.g. four radial struts 94. Each of the shells 102 may be connected to the struts 94, e.g., by welding or brazing. The structure of the collector 40 and the mountings of the shells 102 to the struts 94 may be reinforced by a radial collector fairing 100.

According to an aspect of an embodiment of the present invention a maximum heat load that the collector 40 is likely to be expected to see can be derived. The geometry of the collector 40 and its constituent shells 102 and their portions 102*a*, 102*b* can be created so that, an aspect of desired performance, e.g., focus is, e.g., achieved solely at this temperature. That is, at some known preselected temperature there will be a known geometry of the parts of the collector, resulting in a desired operating parameter, e.g., focus at the intermediate focus 42, selection of a particular λ, etc.

Heating elements (e.g., temperature control mechanism 14 of FIG. 1A) can be attached to individual shells 102 of the collector 40, or, e.g., to the hub 90 and/or its extensions 92, and can, e.g., be utilized to maintain this ideal geometry regardless of duty cycle or repetition rate, which otherwise could cause the temperature of the collector 40 to vary over time, such varying temperature can, e.g. warp the shell portions 102*a*, 102*b* and/or modify their positional relationship to each other. According to another aspect of an embodiment of the present invention, cooling (e.g., temperature control mechanism 16 of FIG. 1A) could be used to maintain the desired fixed temperature, e.g., with the inclusion of Peltier coolers (not shown), rather than heater element, e.g., a model Drift 0.8 (40 mm sq.) 172 watt made by Kryotherm. Shell geometry can thereby be certified at a non-elevated temperature.

In either event, the collector shells 102 may be equipped, e.g., with biomorph piezoelectric actuators such as a model PL122-140 series made by Physik Instrumente, which may be, e.g., bonded, e.g., by brazing, to the exterior surfaces of each shell portion 102*a*, 102*b*. Applying a voltage to the piezoelectric actuators can, e.g., distort the shell portion 102*a*, 102*b*, effectively altering the focal point of the shell 102, e.g., to the intermediate focus 42.

According to an aspect of an embodiment of the present invention each shell 102 may, e.g., have two discrete parts 102*a*, 102*b*, each having its own curvature and/or angular relationship to the other and to the hub 90. Focus can, e.g., be maintained by altering the relationship between the two halves 102*a*, 102*b* along the optical axis. This may be done, e.g., using positioning motors (not shown) or piezoelectric elements (not shown), dependent, e.g., upon degree of motion requirements. The motors or piezoelectric elements may be mounted, e.g., external to the vacuum environment with manipulators (not shown) linked, e.g., via a bellows (not shown) to the shells 102. The shells 102, may in turn, be interconnected, e.g., at the joints 106, e.g., by a thin connecting member, which does not block a significant amount of the light transmitting the collector, such that, e.g., manipulation of, e.g., the joint 106 on the outermost shell 102, as with an actuator as noted above, can serve to manipulate all of the shells 102 at the same time.

Figure 5:
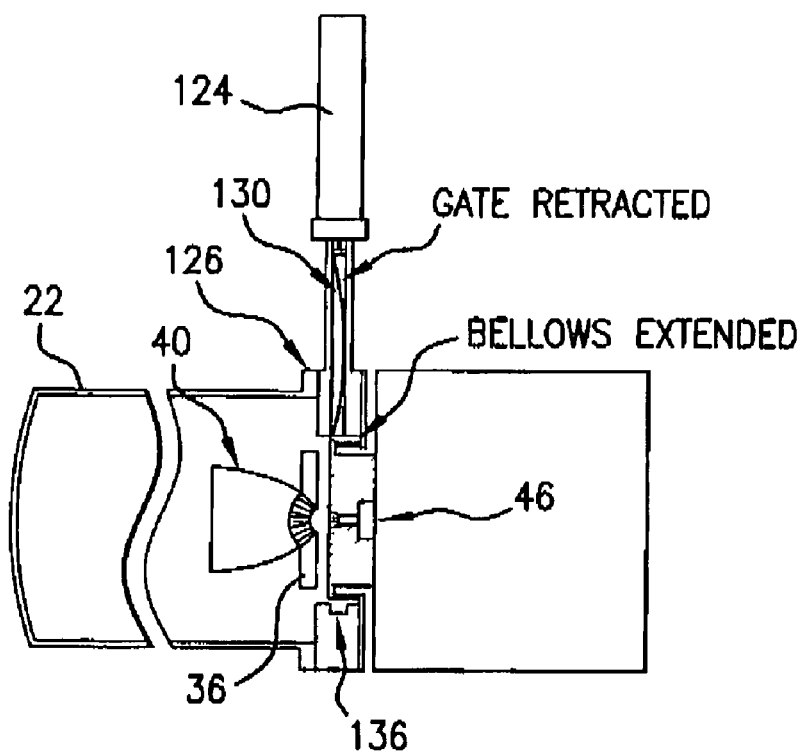
FIG. 5 shows an embodiment of the present invention including an electrode replacement system according to an embodiment of the present invention.
Figure 6:
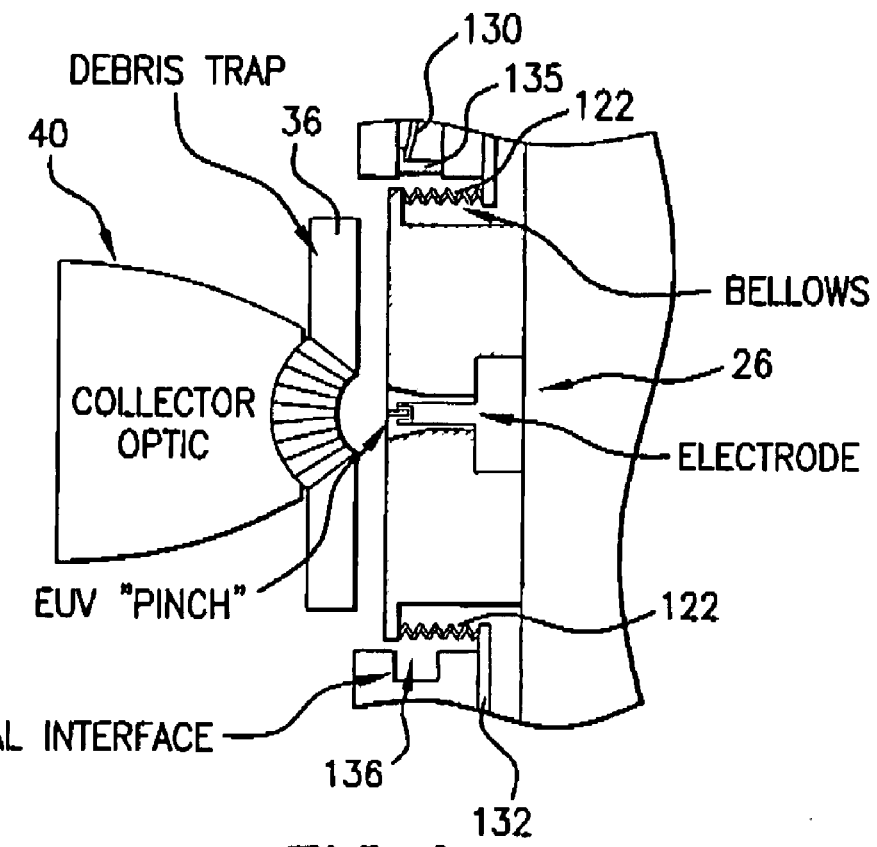
FIG. 6 shows a closer view of the embodiment of FIG. 4.
Figure 7:
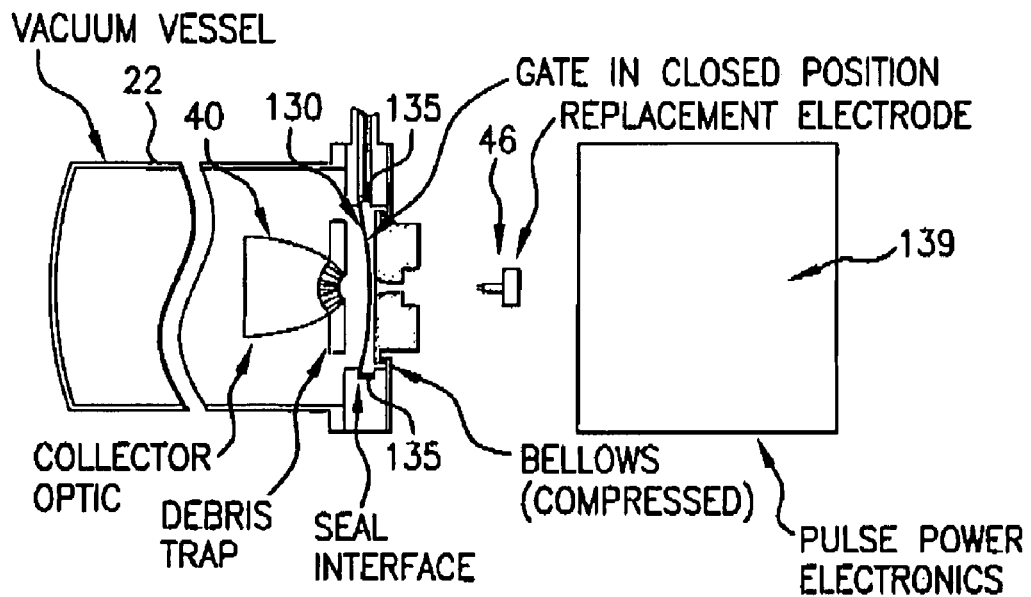
FIG. 7 shows the embodiments of FIGS. 5 and 6 with a gate valve sealing mechanism in place for electrode replacement.

According to another aspect of an embodiment of the present invention, enabling rapid electrode replacement can leverage electrode lifetime as a "cost of ownership" issue. This may be accomplished, e.g., utilizing a quick electrode replacement assembly as shown in FIGS. 5-7.

According to another embodiment of the present invention, the shells 102 may be connected to a bias voltage (not shown) to deflect charged ions of the same polarity as the bias voltage from, e.g., the reflecting surface(s) of the shell 102 and, e.g., toward the roughened surfaces, for debris collection.

At this time, EUV electrode lifetimes are an order of magnitude away from lifetime figures quoted by the lithography industry. As such, replacement costs and machine downtime during electrode replacement constitute a large portion of "cost of ownership" for DPP EUV sources. The electrode 26 is located within a large vacuum chamber 24 that also may house, e.g., collection optics 40, spectral purity filters 50, debris traps 32, etc. Breaking the seal on the vacuum chamber 24, e.g., to access the electrode 26, can, e.g., expose the interior environment of the vacuum chamber 24 to ambient room conditions, e.g., humidity, lack of cleanliness, etc. Upon resealing the vacuum chamber 24, the time to pump down to operating vacuum conditions can adversely impact overall performance (it contributes to the cost of ownership) and may also be difficult due to debris and water vapor attached to the interior walls of chamber due to the exposure to the external environment.

Even in a perfect environment, pump down time is on the order of 5-10 minutes given a chamber 24 of volume currently considered necessary to house the required optical components. Quicker pump down times could be achieved, e.g., by adding additional high vacuum pumps, but a significant cost, approximately $20-$30K each dependent upon model chosen. The critical down time element, however, will likely be removing through the pump down the water vapor trapped within the chamber 24.

According to an aspect of an embodiment of the present invention, e.g., the addition of a sealed flange adjacent to the electrode 26 could eliminate the need for venting the vessel and subsequent pump down following resealing. This location is not favorable for location of such a sealed flange however. By necessity, the collection optics 40 (and therefore the debris trap 36) must be located in close proximity to the point of the pinch 32. Additionally, the area in close proximity to the pinch 32, e.g., can be subjected to temperatures in excess of 2000 degrees C. and can, e.g., also be prone to "plating up" with the metal vaporized from the surface of the electrode 26 during light emission. According to an aspect of an embodiment of the present invention, therefore, the employment of a bellows 122 can be utilized to increase, e.g., the distance between the tip of the electrode 26 and the first optical component, e.g., the debris trap 36, e.g., in order to facilitate replacement of the electrode 26. Such a bellows 122 may also have some utility in regard to the optical alignment of the pinch 32 location, which has been observed by applicants to vary, e.g., with rep rate and gas mixture, and thermal effects on the collection optics, e.g., warping of the collector 40, affecting collector 40 focal length.

By collapsing the bellows 122, a gap between the electrode 26 and first optical component, e.g., debris shield 32, large enough to accommodate a sealing mechanism, e.g., a "gate valve" 130 can be established. This gate valve 130 would perform the function of sealing the vessel 22 during swapping of the electrode 26.

Due to the large thermal loads, e.g., originating from the pinch 32 location, the bellows 122, e.g., must be of a sufficiently large in diameter to survive. However, the diameter of the bellows 122 also dictates, e.g., the size of the gate valve 130 required to seal the chamber 24, since, e.g., it must withdraw from the aperture of the gate valve 130 during normal operation. Locating the bellows 122 in a "shadow" from the electrode 26, e.g., as shown in FIG. 6 can, e.g., considerably lessen the thermal load to which the bellows 122 will be exposed. The "shielded" bellows 122, e.g., positioned between the chamber 24 wall 132 and a flange 134 on the electrode assembly 160, between the bellows 122 and the location of the pinch 32 can facilitate limiting the size of the bellows 122, e.g., a smaller diameter, which can also be true for the gate valve 130.

The gate valve 130 must be free of elastomers as is common to environments in which the EUV optical components are located as any out gassing from any such elastomers would profoundly reduce optical component lifetimes. A drawback of non-elastomeric seals, however, is the stringent requirement as regards surface finish and flatness of the sealing surface. Within the EUV DPP environment these surfaces must be located to, e.g., minimize plating up by the vaporized metal discharged from the surface of the electrode. A further embodiment of the invention could include a replaceable seal surface 136 that could be replaced should the presently installed one become compromised. A further embodiment of this invention would be the inclusion of a dry nitrogen purge point in the vicinity of the seal flange 126. If the seal surface becomes contaminated to a degree that vacuum integrity cannot be maintained within the vessel (during electrode servicing), the leak can be detected and the chamber filled with dry nitrogen to prevent the formation of water vapor and intrusion of debris contained in the ambient environment.

Elements of the EUV light source 20 can be quite large and as a consequence, quite heavy. Individual sections of the vacuum vessel 22 could weigh in excess of 400 lbs. According to an aspect of an embodiment of the present invention independently mounting each module, e.g., vacuum vessel 22 section(s)/DPP electrodes 32/DPP commutator 140, on a common set of linear rails (not shown) enables these sections can be unbolted and slid apart for servicing as shown in FIG. 7. The linear rails can, e.g., serve the dual purpose of easing module handling and alignment during reassembly in the course of electrode exchanges.

According to an aspect of an embodiment of the present invention, materials for the electrode 26 must be carefully considered, along with techniques for their fabrication and their specific structural aspects, taking into consideration the harsh environment in which the electrodes must function, and particularly structural and thermal loads that must be accommodated. Silicon carbide, SiC, is an example of a material with beneficial properties according to an embodiment of the present invention, in that SiC can, e.g., be tuned for high thermal and electrical conductivity. The electric conductivity of this material, and like materials generically referred to as refractory metal carbide ceramics, can also be changed by adding certain refractory impurities, as explained in more detail below.

In addition to tuning SiC, and like materials, the electrical conductivity of Alumina, aluminum oxide ($AlO_2$) can also be tuned, e.g., with the addition of, e.g., Titania. The resulting conductive doped ceramic could, e.g., be able to withstand sputter damage and thermal damage better than any metal. In addition, Titanium Tungsten (TiW) ceramic metal combinations ("ceremets") may also work like SiC and related materials. TiW is conductive and does not need metal doping for electrical conductivity, however, it possesses a more limited thermal conductivity. TiW machines well, and is best suited for use according to aspects of an embodiment of the present invention if produced by vacuum hot pressing. Aluminum oxide-Titanium oxide, alumina-titania ($AlN$—$TiO_2$), systems could also work for lower temperature systems.

Applicants have discovered that metallic electrodes 26, particularly the inner electrode (anode) 30 have a great tendency to melt and/or ablate at the surfaces of the electrodes 26, particularly in the vicinity of the pinch 32, i.e., on the anode 30. Observed damage to the surface of used electrode 26 suggests to applicants that the plasma formed in the pinch 32 can impart significant thermal and ionic energy onto the surfaces of the electrode 26, and particularly the anode 30. Even Tungsten thorium (W—Th) alloys appear to melt, e.g., at about 3500° K, and can be sputtered easily.

Covalent materials tend to be electrically insulating and to better resist ionic damage. A doped ceramic, such as SiC or Alumina could be tuned for both electrical and thermal conductivity. SiC doped, e.g., with BN decomposes at 2700° K, and can be modified to have a thermal conductivity near that of pure aluminum. BN doping levels in SiC can be as high as 30% by weight. Since thermal shock resistance trends proportionally with material thermal conductivity, strength and fracture toughness and is inversely proportional to the expansion coefficient, SiC—BN composites could exhibit very high thermal shock resistance. The thermal shock resistance of Alumina is 200° C. (ΔT° C.) and BN—SiC composites exhibits a 630-1200° C. (ΔT° C.) with BN doping at, e.g., 30%.

Electrical conductivity could be tuned close to the surface of the electrode 26, since the bulk conductivity of the ceramic there may be inadequate. As for alumina materials, surface conductivity could be enhanced by metal oxide doping (SnO, TiO2) without significant adverse changes to the other beneficial properties of the material.

SiC—BN or Alumina-Titania systems can be synthesized in many ways.

Figure 8:
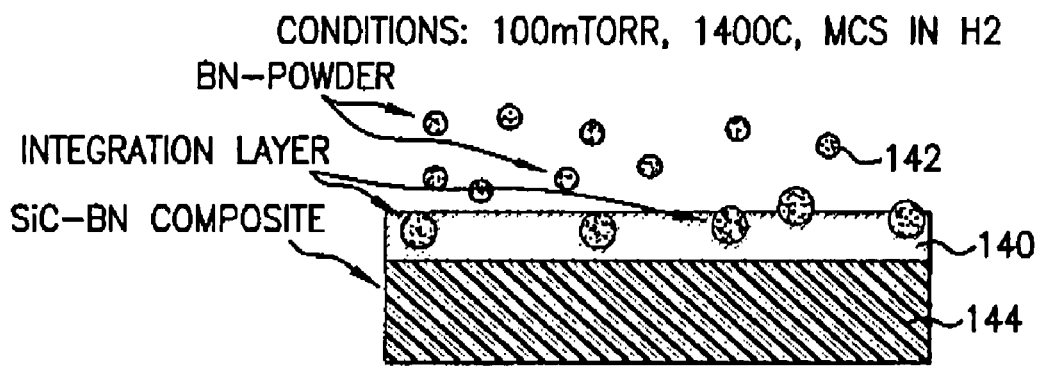
FIG. 8 shows a schematic view of a process for fabricating materials useful in electrodes for DPP according to an embodiment of the present invention.
Figure 10:
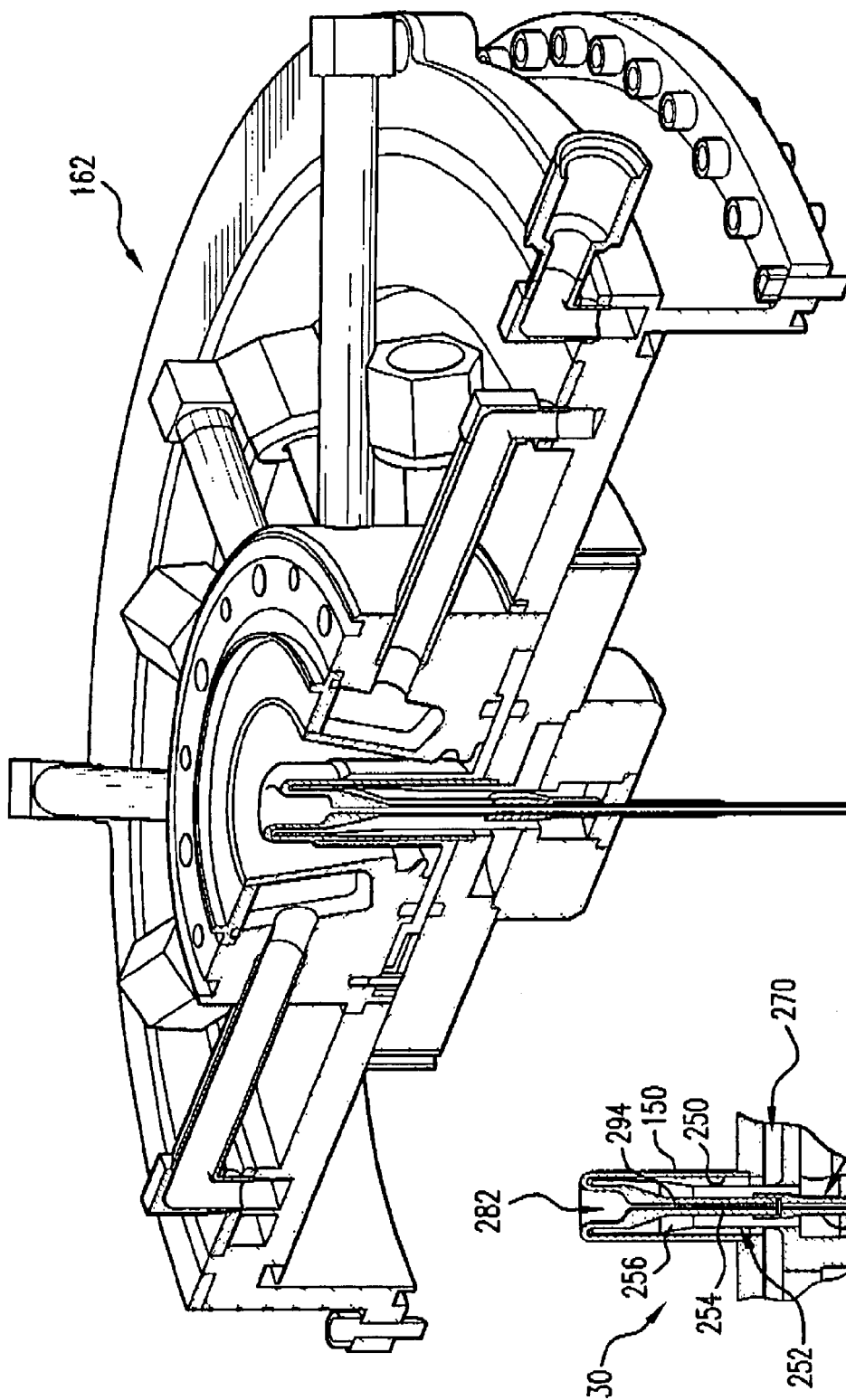
FIG. 10 shows a perspective cut-away view of an electrode assembly according to an embodiment of the present invention.

Plasma spray or liquid phase sintering can be used with mixed source powders. For optimum material density, which can be critical for an electrode that will not crack or explode, one could modify a particulate enhanced CVD growth process such as the one used by Trex in Kauai. Based on the available literature and information, e.g., as found in the web page of Trex Enterprises, www.trexenterprises.com referring to a "CVC technology for the production of economical ultra high purity silicon carbide parts, it is applicants' understanding that Trex adds SiC powders into a SiC CVD process, using, e.g., Methyl-Chloro-Silane ("MCS"), to assist with keeping high bulk density at high growth rates. According to an aspect of an embodiment of the present invention, part of this SiC powder could be substituted with BN powder, thereby allowing the nano-particulate BN to incorporate uniformly into the ceramic. Since the Trex's process is done at low pressures (100 Torr), the electrode will have relatively low dissolved gasses and have a high density. The Trex SiC material is close to 100% dense, which is the ideal. Such a process is illustrated schematically in FIG. 8, e.g., showing schematically the synthesis of SiC—BN composite via particulate enhanced CVD, i.e., the thermal decomposition of Methly-Chloro Silane 140 onto BN particles 142 in the presence of a SiC surface 144, e.g., in a reducing environment, e.g., 100 mTorr, 1400° C., with an MCS in the presence of $H_2$.

Other synthesis methods can be, e.g., for Alumina—TiW: A) sintering in a reducing environment to create non-stoichiometric oxides on ceramic surfaces, i.e., which are oxygen deficient and conductive; B) placing alumina in titania and sinter/diffusing the two together; C) depositing alternating layers of the 2 materials and then firing the system at >1900° C. or D) vacuum hot pressing, which, e.g., could be used for pure W, since hot presses of refractory metals can contain high dissolved gas levels. High dissolved gas levels promote electrode pitting and volcanic type eruptions in metal electrodes.

Figure 9:
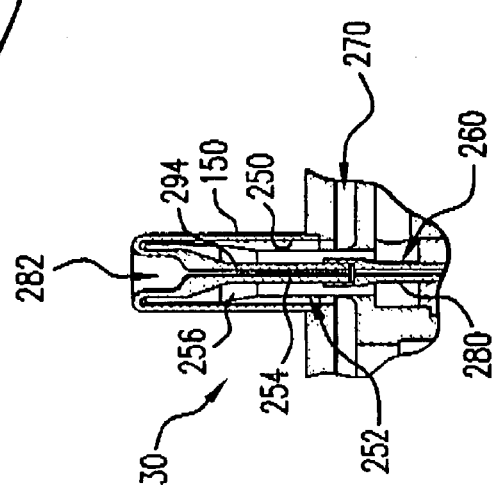
FIG. 9 shows a cross-sectional view of a center electrode (anode) according to an embodiment of the present invention.
Figure 11:
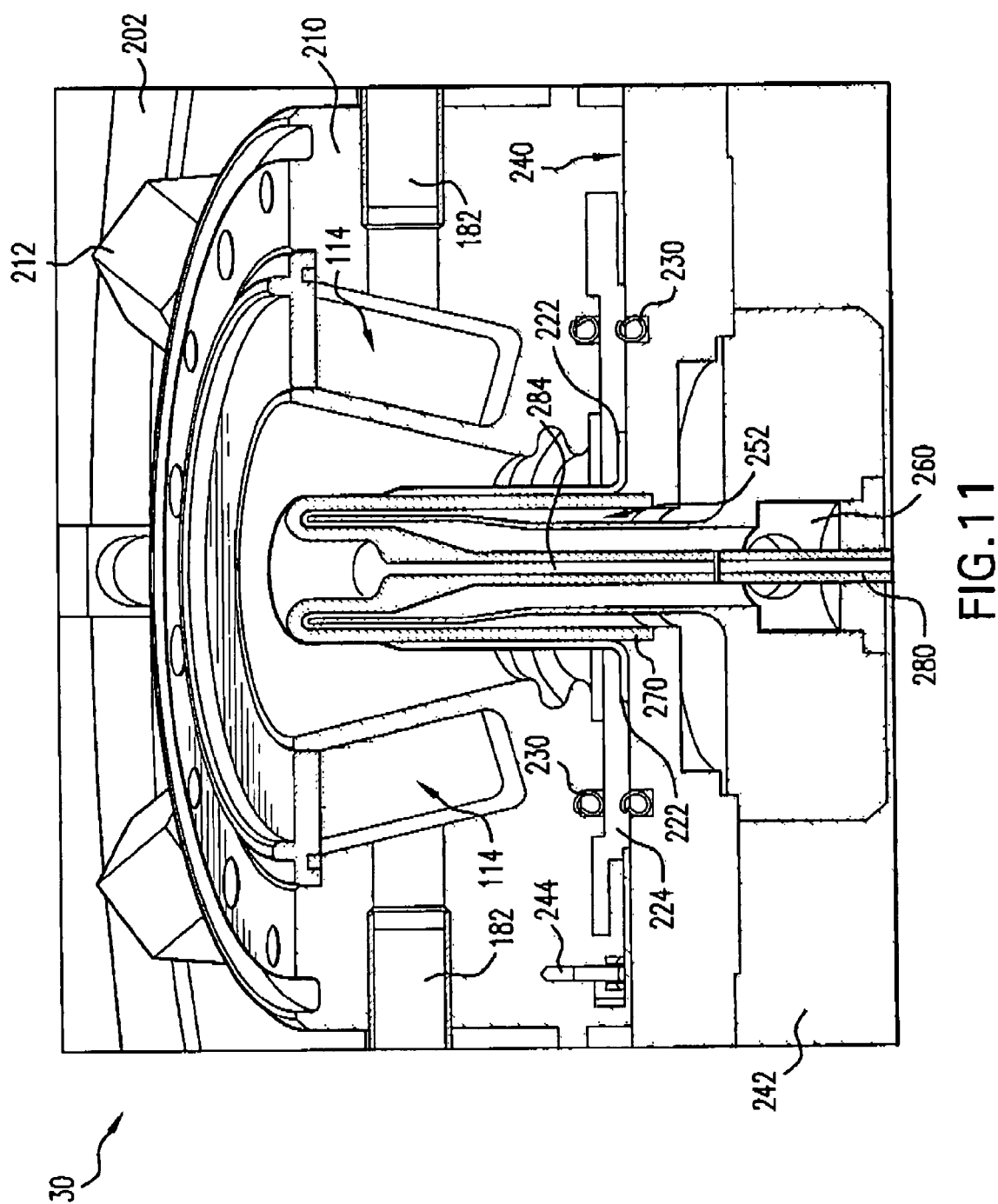
FIG. 11 shows a closer perspective cut-away view of a portion of the electrode assembly shown in FIG. 10 and the center electrode (anode) shown in FIG. 9.
Figure 12:
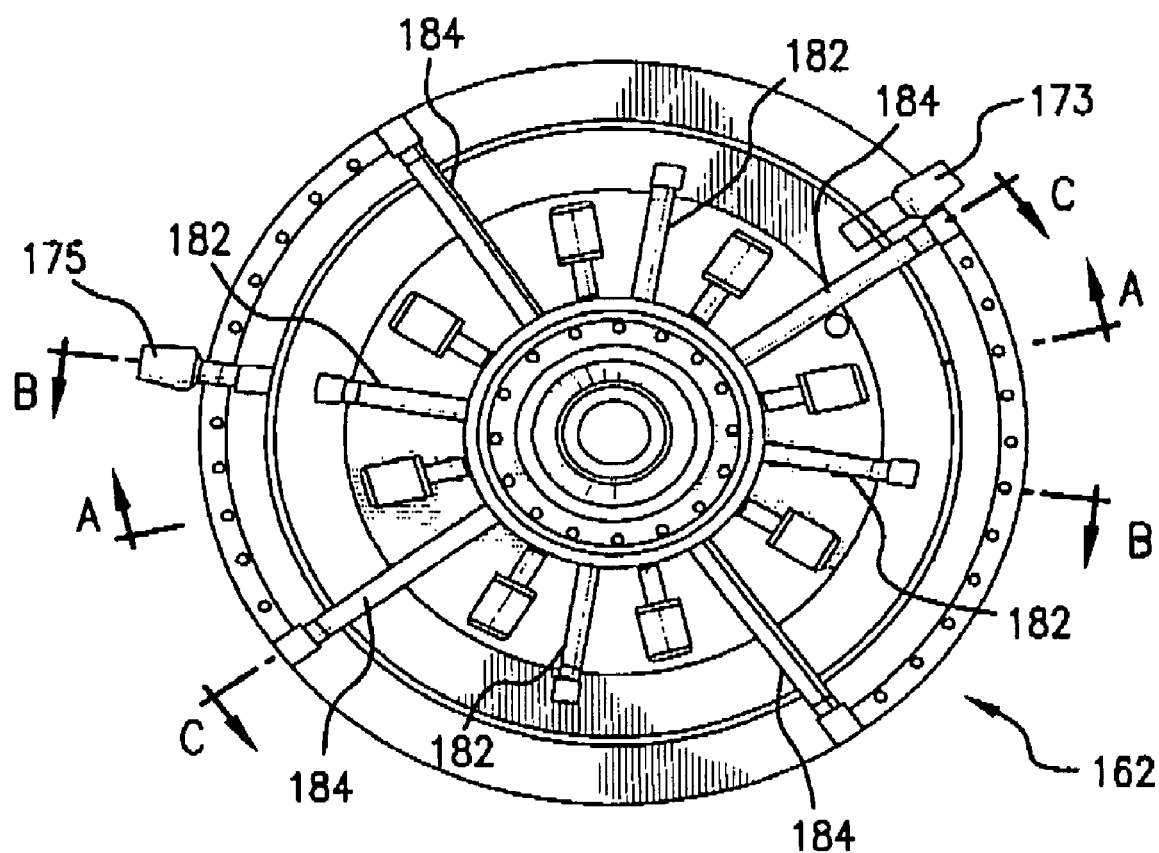
FIG. 12 shows a top view of the electrode assembly shown in FIGS. 10 and 11.
Figure 12A:
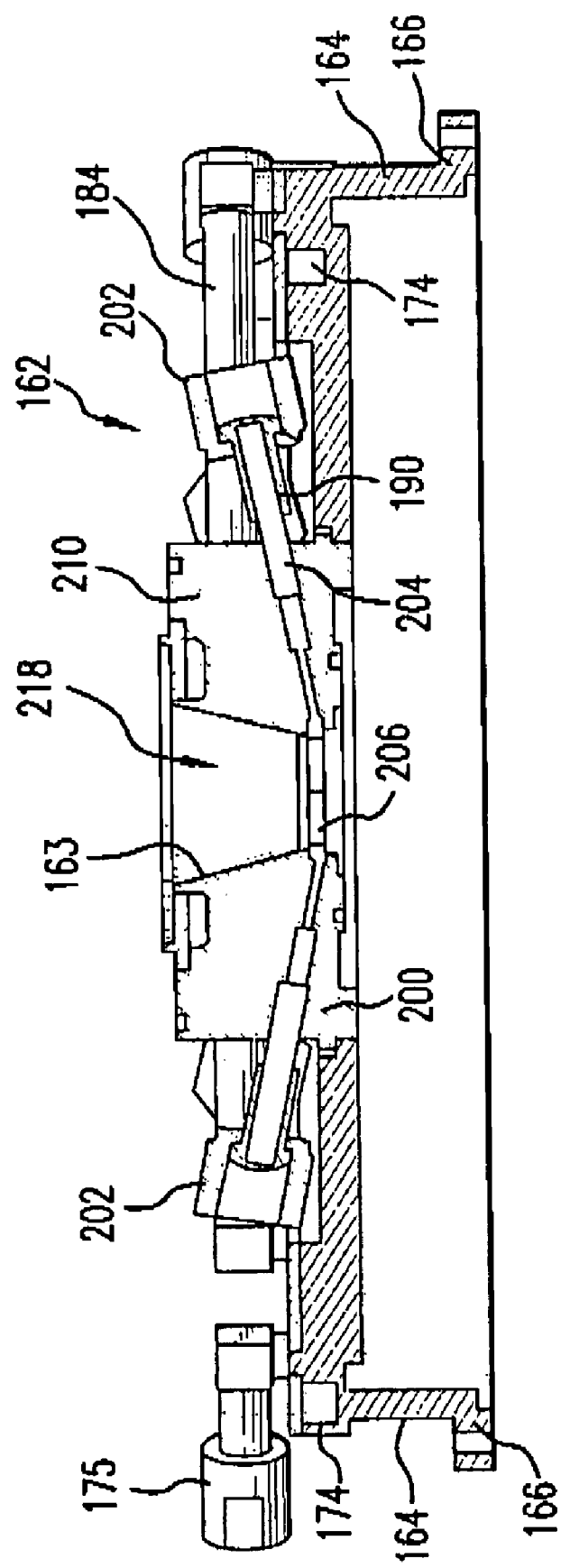
FIGS. 12a-c show cross-sectional views of the electrode assembly of FIGS. 10-12 with the cross-sections taken along lines A-A, B-B and C-C in FIG. 12, respectively.
Figure 12B:
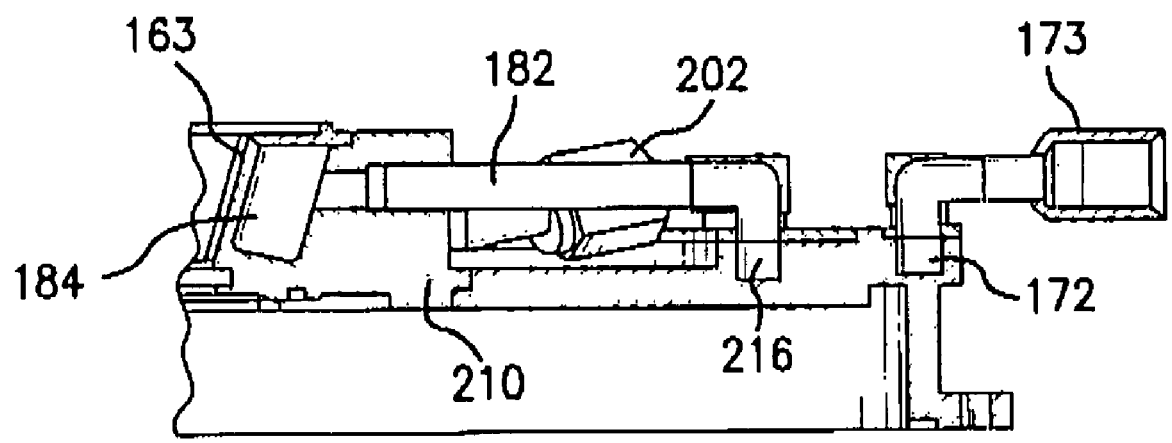
Figure 12C:
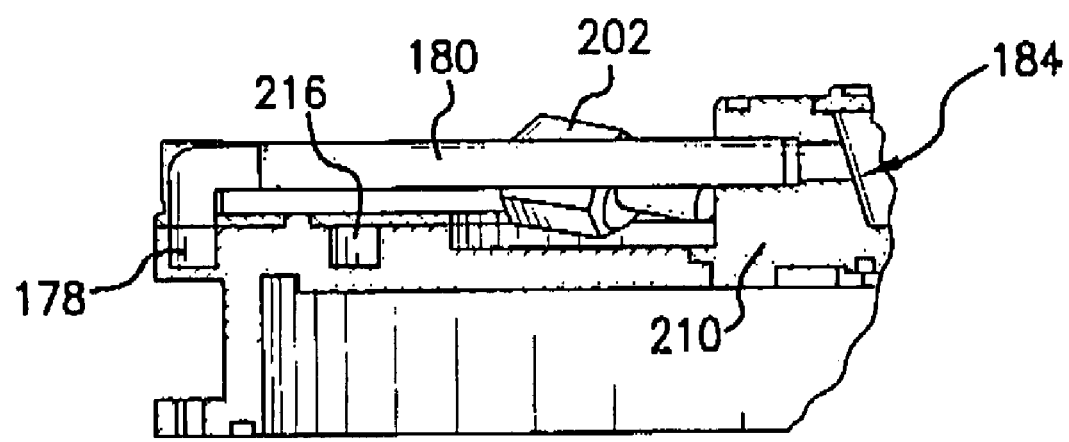
Figure 13:
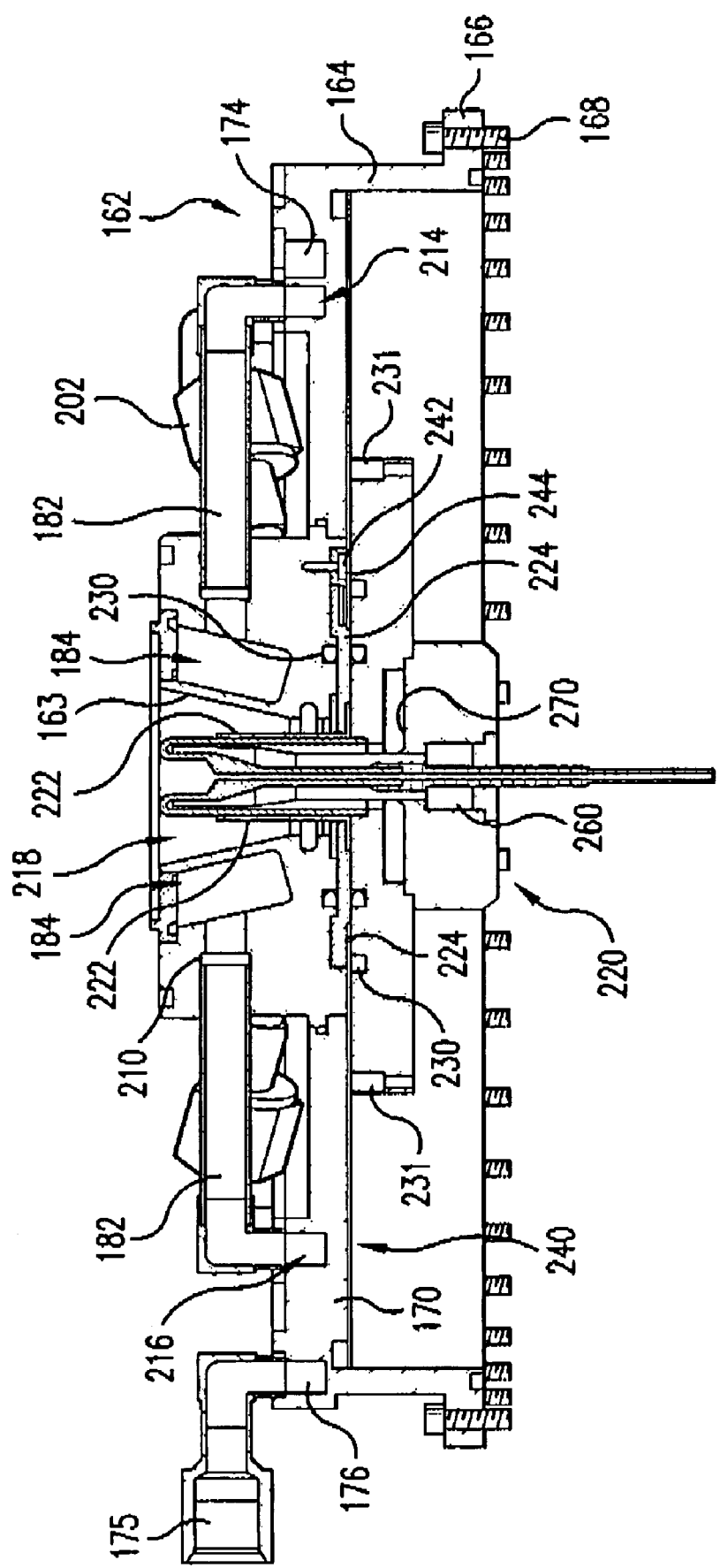
FIG. 13 shows a cross-sectional view of the electrode assembly of FIGS. 10-12c with a center electrode (anode) assembly included.
Figure 14:
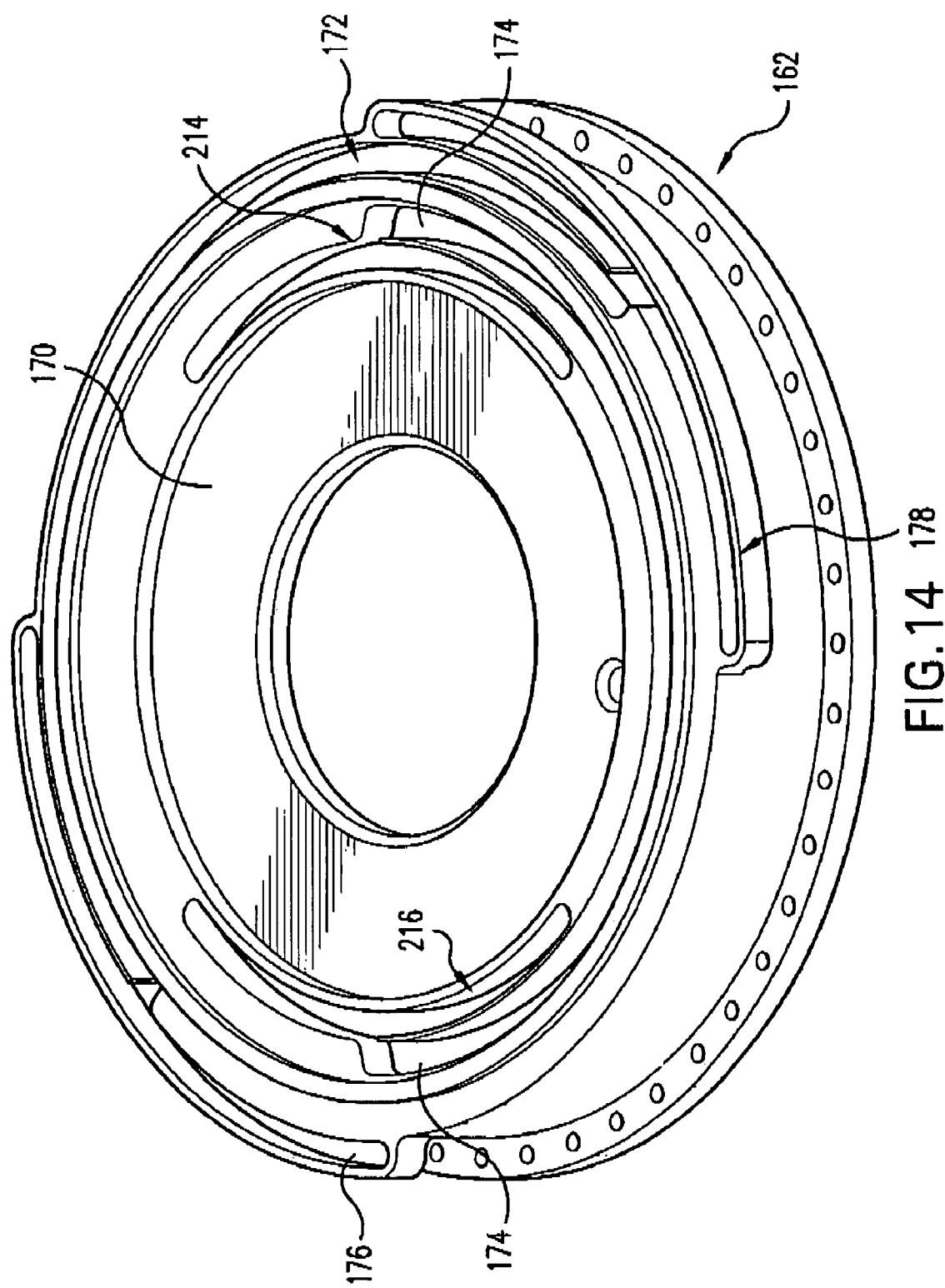
FIG. 14 shows a cold plate portion of the assembly of FIGS. 10-13 showing cooling channels according to an embodiment of the present invention.

Turning now to FIG. 9 three is shown an electrode 26, e.g., an anode 30, which may, e.g., have an outer surface 150 which may, e.g., be formed of doped alumina or SiC—BN, which could also be, e.g., undoped TiW.

A discharge produced plasma focus light source 20 for EUV, e.g., for use in microlithography also brings about other requirements regarding the electrodes 26, particularly in regard to cooling and fabrication requirements. The coaxial electrode set of a cathode 28 and an anode 30, shown schematically in FIG. 2 can be, e.g., exposed to high average heat flux (>1 kW/cm$^2$) and extremely high transient heat flux (>1 MW/cm$^2$) during pulsed operation. This can require, e.g., the use of refractory metals and specialized alloys, e.g., as discussed above, in conjunction with the best available cooling techniques. High vacuum and structural integrity joints can also be required between dissimilar metals with varying thermal expansion coefficients.

Referring to FIGS. 9-16 there is shown an embodiment of the present invention including an electrode assembly 160. The electrode assembly 160 can, e.g., include a cathode (outer electrode) assembly 162 and an anode assembly 220. The cylindrical anode 30 (inner electrode) has been tested by applicants in a number of geometric embodiments with various outer diameters. The smallest cooled device was tested with an OD of 0.625 inches and another was tested with an OD of 0.725 inches. Larger electrodes up to 1" OD or even greater are contemplated to be needed in the future. The cooling of larger electrodes, however, can be less challenging due to the larger area over which the heat flux is distributed. The joints between dissimilar metals, however, become more difficult in larger diameter electrodes, due to the larger relative change in dimensions with temperature, e.g., during fabrication and operation. Conversely the smaller diameter electrodes may be easier to fabricate but more difficult to cool during operation. The design can also be complicated in general by the need to deliver a plasma source, e.g., a gas, currently contemplated to be, e.g., xenon, through the center of the electrode. The delivery may also be of a metal in a solid or liquid state. The electrode 26 along with the plasma source being delivered can be considered to be a consumable and is therefore also cost sensitive.

Typically a mixture of braze and fusion welding techniques can be useful in assembling electrodes of the type contemplated in an embodiment of the present invention. The type of joint and order of fabrication may be determined, e.g., by the specific design. Where possible easily weldable stainless steels, for example 304L or 316L, can be used to fabricate the electrode assembly 160. This can, e.g., keep the cost of materials down, simplify the machining and assembly and improve the yield of finished parts. Due to the high surface temperature transients the electrode 26 proper can, e.g., be fabricated from a refractory metal such as tungsten or its pseudo alloys including W—Cu, W—La, W—Th and W—Re. This can, however, present the problem of joining a brittle, refractory metal with a low coefficient of thermal expansion (CTE) of ~4.5 ppm/° C. to, e.g., steel, which has a relatively high CTE of ~16.6 ppm/° C. Such a joint may be required to be, e.g., high vacuum compatible and able to simultaneously withstand internal coolant pressures, e.g., in excess of 1000 psig. The design may further be complicated by the need to machine, e.g., deep annular cooling channels in the tungsten, which ordinarily cannot be turned or milled, even with so called 'machinable' types of pseudo alloys, and must be created, e.g., by electrical discharge machining ("EDM") and grinding processes. High precision machining of most parts is required to ensure adequate and uniform cooling of the electrode assembly 160 with the added requirements, e.g., of a tightly constrained cooling volume.

According to an aspect of an embodiment of the present invention applicants currently contemplate that the tungsten to steel joint be brazed, e.g., using gold and nickel alloys such as NIORO® (82% Au-18% Ni) at temperatures of ~1000° C., e.g., in a vacuum furnace at pressures of, e.g., in the range of 10-6 Torr. Gold has been selected by applicants because of its ability to wet tungsten well and its high ductility, which can, e.g., result in lower residual stresses in the joint. The specific design of the joint according to an aspect of an embodiment of the present invention can be such that the steel provides an annular mounting slot for the tungsten. During heating in the furnace the more rapidly expanding steel can strain the tungsten elastically from its inner diameter. This can have, e.g., the dual benefit of reducing the residual stresses in the tungsten upon cooling and also centering the tungsten accurately in the steel base. Lower residual stress is of critical importance to avoid cracking of the tungsten.

Another possible technique according to an aspect of the present invention is to utilize copper backcasting. Applicants contemplate a process in which includes pouring molten oxygen free copper around, e.g., a refractory metal electrode blank. The finished part can then be machined from the resulting assembly. Although oxygen free copper has a CTE of 17 ppm/° C., it is soft and ductile with a yield stress of only 10 ksi (~25% of austenitic stainless steels such as 304L) and, therefore, it can yield locally at the joint and greatly reduce the compressive stress on the tungsten. It can be subsequently annealed if desired to further lower the residual stresses. One particular advantage of such a process is the excellent vacuum and structural properties of the joint. Such a joint produced by such a process can be, e.g., generally less prone to leakage, which can otherwise be a problem with brazed assemblies.

A principal drawback to this technique is, e.g., the lack of strength in the copper. Copper, e.g., does not cope well with threaded details or high local bearing forces exerted by metal seals, which according to aspects of an embodiment of the present invention could be considered essential for the present application. However, such problems can be avoided, e.g., by careful design and are not considered by applicants to be limiting in the use of the technique to fabricate DPP EUV electrodes according to aspects of an embodiment of the present invention. Plansee, including its American subsidiary, Schwartzkopf, among others, is a source for joints commercially fabricated according to the just referenced process(es).

Tungsten electrodes larger than ~0.75" OD brazed to steel can have, e.g., a high risk of cracking due to residual stresses at the joint interface. A technique to avoid this can be, e.g., to use a transition insert in the joint. Material selection for the transition insert can require, e.g., a material with a CTE close to that of tungsten but also with good ductility to better deal with the higher stresses, e.g., which can eventually be realized at the boundary with the steel. Good machinability is also a helpful property. According to an aspect of an embodiment of the present invention applicant contemplate using molybdenum, with a CTE of 5.35 ppm/° C., due to its ability to meet required criteria and the fact that it lends itself well to brazing with similar techniques. This can be especially useful for contemplated larger diameter tungsten electrodes, which, e.g., suggests utilizing this concept in the engineering design.

According to aspects of an embodiment of the present invention, the electrode assembly 160 may comprise a outer electrode assembly 162, which may have an electrode assembly side wall 164 connected to an electrode assembly mounting flange 166 for mounting the electrode assembly 160 to the SSPPM 139 with mounting screws 168. The generally cylindrical side wall 164 may be connected to or integral with a circular cold plate 170 which may have machined in it a central opening for insertion of a cathode base 210 and a plurality of cooling channels 172, 174 and 214, 216.

The outer electrode (cathode) base 210 may have machined into it a plurality of cooling channels 184 and inlet tube 182 openings and outlet tube 180 openings, forming, e.g., four channels 184, each with an inlet tube 182 and an outlet tube 180, for cooling the cathode 28. The coolant may enter from a coolant inlet 173 to an inlet plenum 172, which is connected to a pair of opposing inlet plenums 176 and 178 (shown in FIG. 12c and FIG. 14). Each of two of the four long tubes 180 is connected to the inlet plenum 176 or 178. Each of tow of the four short outlet tubes 182 is connected to a respective channel 184 and to an outlet plenum 214 or 216, each of which are connected to a coolant outlet 175.

The cathode base 210 may also be machined to contain a central opening 218 that forms the cathode inner wall 163.

The materials for the electrode assembly 160, including the outer electrode (cathode) assembly 162 and the inner electrode (anode) assembly 220, can be, e.g., stainless steel type 304L, except for the anode 30, which may be made of sintered tungsten, or materials discussed above. A critical dimension may be the separation between the partition 256 and the point where the inner walls 250 and 254 meet at the top of the electrode 30 and must be selected based upon the desired amount of coolant flow that needs to pass this point between the partition 256 and the electrode walls 250, 254 for adequate cooling.

According to an aspect of an embodiment of the present invention a simple open channel cooling arrangement may be utilized to cool the anode 30, e.g., wherein the coolant flows up one inner wall 250 of the inner electrode (anode) 30, formed by the anode 30 having a hollow interior 252 of the electrode 30, and then flow down the other inner wall 254 of the inner electrode (anode) 30, which may be facilitated by the imposition of a heat pipe partition 256 between the inner walls 250, 254 within the hollow interior 252. Heat transfer can be achieved by convection at the boundary between electrode inner walls 250, 254 and coolant passing between the inner walls 250, 254 and the partition 256. Applicants have determined that best thermal results can be achieved in this application, e.g., with the coolant flowing up the interior inner wall 254 and down the outer inner wall 250.

Another consideration is, e.g., the thin walled (0.010") partition 256, which according to an aspect of an embodiment of the present invention can separate the inlet 260 of the inner electrode (anode) 30 cooling system, leading to the passage between the partition 256 and inside inner wall 254 from the exhaust channel 270 of the heat exchanger for the cooling of the inner electrode 30 exhausting the passage between the partition 256 and the outside inner wall 250. This partition 256, according to an aspect of an embodiment of the present invention may be, e.g., better loaded in tension by the coolant pressure rather than compression, e.g., to avoid buckling, which can be the consequence of the just described flow path. Such a scheme can, e.g., also enable the design to utilize the full yield strength of the material of the partition 256, e.g., 304L. Applicants have tested a prototype electrode 30 cooled this way with flow rates up to 37 lpm and with entry pressures of >800 psig. Applicants believe that such a design may be capable, e.g., of withstanding inlet water pressures well in excess of 1000 psig and above and thermal loads corresponding to source plasma discharge repetition rates above 3 kHz, and above.

Annular channels, however, e.g., may need a high heat transfer coefficient. according to an aspect of an embodiment of the present invention, e.g., the limited area exposed to the coolant, e.g., can require very efficient heat transfer and thus a high heat transfer coefficient. Also, according to an aspect of the present invention, higher temperatures, e.g., at the inner walls 250, 254, can, e.g., require the need to deliver high flow rates of coolant at high pressure, e.g., to suppress coolant boiling, particularly sheet or bulk boiling as opposed to nucleate boiling, which may actually improve heat transfer from the inner walls 250, 254 to the coolant.

According to another aspect of an embodiment of the present invention, applicants contemplate the use of a porous metal heat exchanger within the hollow interior of the electrode 30. In such an embodiment (not shown), e.g., a porous metal media may, e.g., be bonded to the inside walls 250, 254 of the electrode 30, e.g., particularly in the region of the tip 34 containing the pinch opening of the electrode 30, e.g., by brazing. This can result, e.g., in what amounts to a large extended fin on the anode 30, for cooling purposes. The conductive heat transfer from the inner walls 250, 254 into this extended porous surface area, e.g., can be more efficient than the convective heat transfer across the simple wall of the annular channels into the coolant. The extended porous surface area, e.g., then can have a much greater area from which to exhaust its heat into the coolant. The result can be, e.g., better heat transfer using less coolant. Such a structure could also replace the partition 256 and inner walls 250, and 254 throughout the entire hollow portion 252 of the electrode 30. A possible drawback with porous metal heat exchanger, e.g., can be a high inherent pressure drop across the porous medium. At high source repetition rates this could, e.g., require high inlet pressures and result in large mechanical stresses in the braze joints and flow partition associated only with the pumping of coolant, which will need to be addressed. Another potential drawback can be, e.g., the temperature drop across the walls of the electrode 30, due, e.g., to the more effective heat transfer into the coolant, which magnifies the temperature drop across the walls of the electrode 30, which can produce high stress loads across the shell walls of the electrode 30.

Higher stress levels may lead to structural failure in the tungsten shell walls of the electrode. Another design criteria may be, e.g., alternating stresses in the electrode 30 shell walls, e.g., due to operation of the electrode 30 in a burst mode, which can, e.g., have different consequences than static stress loads. This results in, e.g., the requirements that the material of the electrode 30 be both tensily strong and also tough. The distribution of heat flux incident on the electrode 30 may also be of consideration in determining, e.g., electrode lifetimes, e.g., in different modes of operation, including repetition rate, pinch temperature, duty cycle, etc. Applicants have, however, tested, e.g., porous tungsten electrodes, e.g., obtained from Thermacore up to repetition rates of 2 kHz in a negative polarity configuration without failure. Another possibility according to an aspect of an embodiment of the present invention could be, e.g., the use of porous copper cooled electrodes 30, e.g., made using a porous copper foam, e.g., available commercially from Porvair, which can be, e.g., machined by electrical discharge machining ("EDM") into useful geometries for application according to embodiments of the present invention. Another possibility according to aspects of an embodiment of the present invention is to employ uniformly deposited silver to selected optimized brazing thicknesses for brazing using, e.g., electroplating or ionic fusion techniques. Such an approach may, e.g., realize the full potential of porous metal cooling as discussed above for the inner electrode (anode) 30.

According to an aspect of an embodiment of the present invention, high heat flux cooling may be realized by using, e.g., micro channels. According to this embodiment, e.g., coolant may be pumped at high inlet pressure through a series of small passages, micro-channels. Typically these passages may be, e.g., tubular or rectangular and have overall dimensions of 0.020 inches or less. The ratio of channel surface area to coolant volume in such an arrangement may be favorable and this technique, similar to that used currently to cool laser diodes and other high heat flux electronic devices and power semiconductors, may be utilized in cooling the electrodes 30 of the present invention. Applicants have tested prototype micro-channel-cooled electrodes 30 up to repetition rates of 2 kHz and believe that much higher repetition rates are achievable with this cooling technique. This technology does present relatively high pressure drops from inlet to outlet, however, and may result also in stress in the assembly during source operation, e.g., brazing a relatively stiff micro channel insert inside the hollow portion 252 of a tungsten shell anode 30, as discussed above, may, e.g., result in additional constraints and stresses in the anode assembly 220, which will have to be accounted for in the overall design.

The outer electrode (cathode) 28, e.g., as shown in FIGS. 10-15, can include a cathode assembly 162 that can, e.g., be generally annular in shape. The cathode 28 itself, within the cathode assembly 162, may have the form of a 15° conical inner surface 163, e.g., that faces the inner electrode 30, e.g., with a clearance varying from, e.g., 0.19 inches at the base to 0.46 inches at the upper edge. The upper edge may be covered by a cathode lid 212. The outer electrode (cathode) 28 may be, e.g., much larger than the inner electrode (anode) 30, and is, therefore, less challenging to cool. According to an embodiment of the present invention, also erosion of the outer electrode 28 can be less of a problem than with the inner electrode 30 and therefore material selection and thus fabrication can also be somewhat more simple. This outer electrode (cathode) 28 may, therefore, not be considered to be a consumable.

According to an aspect of an embodiment of the present invention, the outer electrode (cathode) 28 may, e.g., be fabricated, e.g., from Glidcop® AL-15, a proprietary oxide dispersion strengthened copper available from OMG Metals Inc. according to an aspect of the present invention, this material was selected, e.g., for its high thermal and electrical conductivity, and also, e.g., combined with good mechanical strength and reasonable machinability. Such a Glidcop® outer electrode 28 can, e.g., be brazed into, e.g., a 304L stainless steel base 210.

The base 210 can, e.g., interface the outer electrode 28 with portions of a DPP pulsed power unit 139 shown in FIG. 7. Applicants have brazed the outer electrode 28 to the base 210, e.g., using either a nickel based alloy, e.g., Nibsi® (Nickel/boron/silicon), available from Morgan Crucible Company plc, and, more recently, NIORO® braze material, available from Morgan Crucible Company plc, which was also used for brazing in the inner electrode 30, as discussed above, also using similar braze preparation and furnace processes as for the inner electrode also as described above.

As mentioned above, the task of cooling the outer electrode 28 is simplified over the inner electrode 30 due to its larger size and use of a high thermal conductivity material. Relatively large open channel water galleries 184 may, e.g., be machined into the Glidcop® outer electrode 28 body 210, which may be supplied and exhausted, e.g., through 316L tubing formed, e.g., of short tubes 182, e.g., brazed into openings in the body 210, and also connected to an inlet manifold 214 and exhaust manifold 216. According to an embodiment of the present invention, e.g., four or more of such galleries 184 may be provided to ensure uniform coolant flow, and thus more uniform cooling at all locations. Inlet and exhaust plumbing, e.g., inlet plenum 214 and outlet plenum 216 (shown in more detail in FIG. 14) may be arranged, e.g., to have similar flow resistance for each gallery 184, thus a similar amount of coolant flows through each one. According to an aspect of the present invention, applicants anticipate that open channels 184 with a high flow rate of coolant and sufficient backpressure to prevent boiling, as discussed above, can, e.g., suffice for cooling the outer electrode 28. However, if needed, e.g., the porous media or micro-channels cooling discussed above may be employed.

According to an aspect of an embodiment of the present invention there may be included, e.g., an integral cold plate 170 machined into the top surface of the 304L cathode assembly 162. The flow channels of this cold plate 170 (shown in more detail in FIG. 16) may include, e.g., the actual inlet manifold 214 and exhaust manifold 216 for the electrode 28. This may be done, e.g., to cool a pulsed power output switch, LS3 (not shown), which may be located, e.g., below the electrode assembly 160, as well as to, e.g., equalize the flow to each cooling gallery 182. The channels, e.g., 214, 216, may be, e.g., milled into the top of the cathode assembly 162 and may also be, e.g., sealed, e.g., with fusion welded plates.

The outer electrode 28 may be formed of the walls of the cooling channels forming the cooling galleries 184 and may have braised to its top end and to the cathode base 210 a cathode lid 212 that serves to seal the coolant galleries 184.

The cathode assembly 163 may be joined to the anode assembly 220 by screws 231 and may be insulated from one another by, e.g., an overlap center insulator 222, which can, e.g., be made of, e.g., pyrolitic boron nitride or alumina and can, e.g., extend axially along the outer walls of the inner electrode 30 and by an elastomer free electrode insulator 224, which may be made from, e.g., pyrolitic boron nitride or alumina, and may, e.g., be held in place by an insulator retainer clip 242 and its set screw 244. Sealing may be provided between the insulator 224 and the cathode base 210 and anode assembly 220 by a pair of elastomer free metal C sealing rings 230, one between the insulator 224 and the cathode base 210 and one between the insulator and the anode assembly 220, inserted into respective opposing grooves.

According to another aspect of an embodiment of the present invention, debris mitigation is considered an import consideration for an operative long-lived DPP EUV light source. According to one aspect of an embodiment of the present invention, the center electrode 28 of a Discharge produced plasma EUV light source may be, e.g., fabricated from a high temperature, possibly refractory, material, as noted above, and also may be, e.g., possessive of a strong magnetic permeability. according to this aspect of an embodiment of the present invention, debris eroded from the electrode 30, as a result of, e.g., plasma bombardment, surface melting or ablation, surface boiling, etc., may, e.g., be substantially magnetic as well. according to an aspect of the present invention applicants contemplate, e.g., the generation of a suitably large magnetic field at least about 50 mTesla ("mT") and e.g., within a range of 50 mT to 1 T, in the optical path between the location, e.g., of the plasma and, e.g., the collector optical element. In this way, e.g., debris may be deflected and then collected, e.g., quasi-permanently by, e.g., a suitably placed stationary magnetic (not shown), e.g., arranged around the perimeter of the optical path. According to an aspect of this embodiment of the present invention, this collector magnetic field may be, e.g., generated by electromagnets, in which event, debris can be, e.g., swept out during a regeneration cycle, e.g., during which the electromagnets may be de-energized. A suitable cooled high temperature refractory magnetic metal may be, e.g., cobalt.

According to another aspect of an embodiment of the present invention, applicants contemplate the use of shaping of the current pulses to the electrodes 30, 28, e.g., to make optimum use of the current, e.g., in compressing the active element (plasma source), typically by, e.g., peaking the current during the magnetic compression phase of the discharge. According to an aspect of this embodiment, the SSPPM may include, e.g., an additional saturable inductor in the last stage of the DPP SSPPM. A possible optimum waveform can, e.g., start out with a modest current during the axial rundown phase and then peaks during the radial compression phase.

Figure 18A:
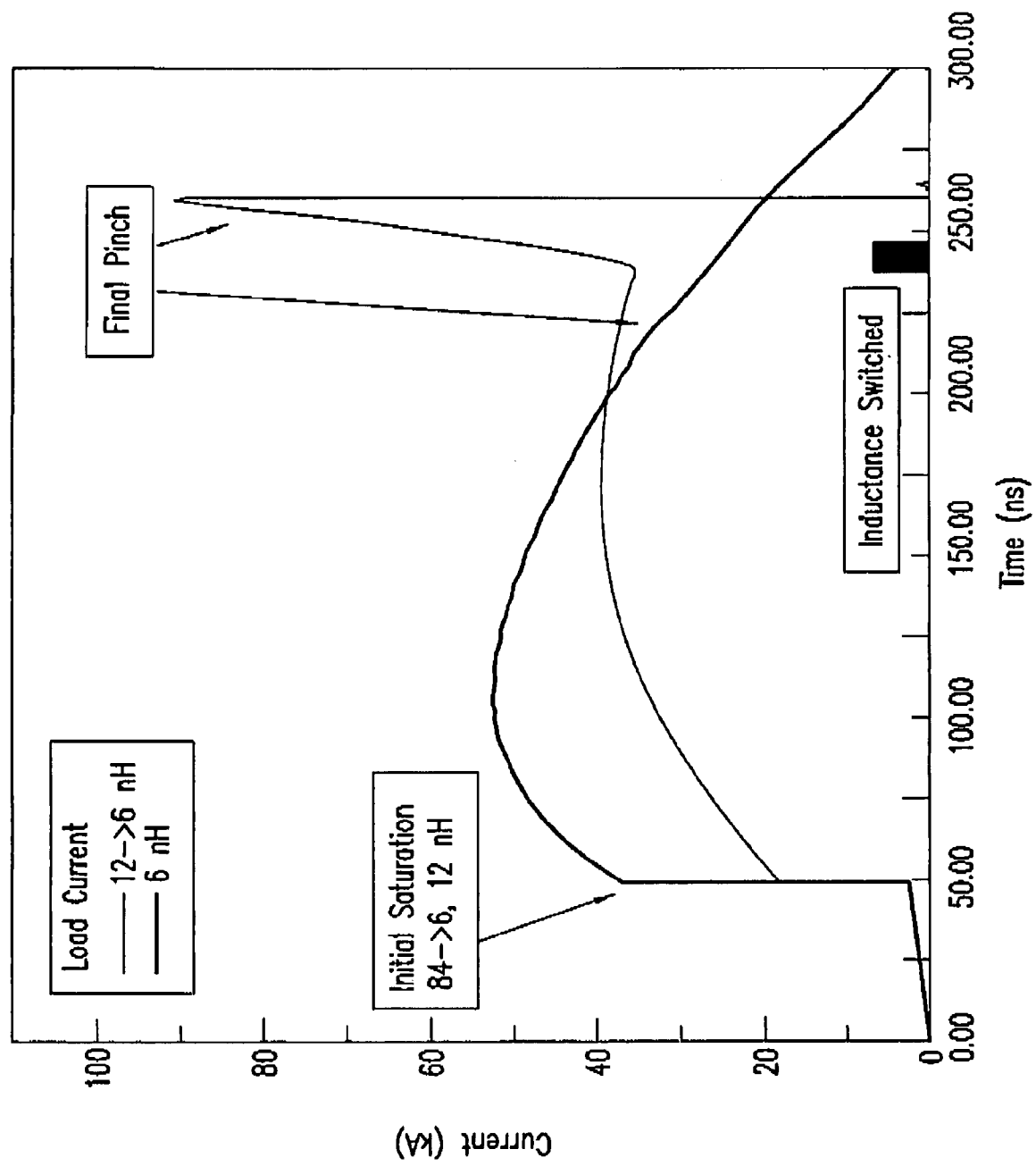
Figure 18B:
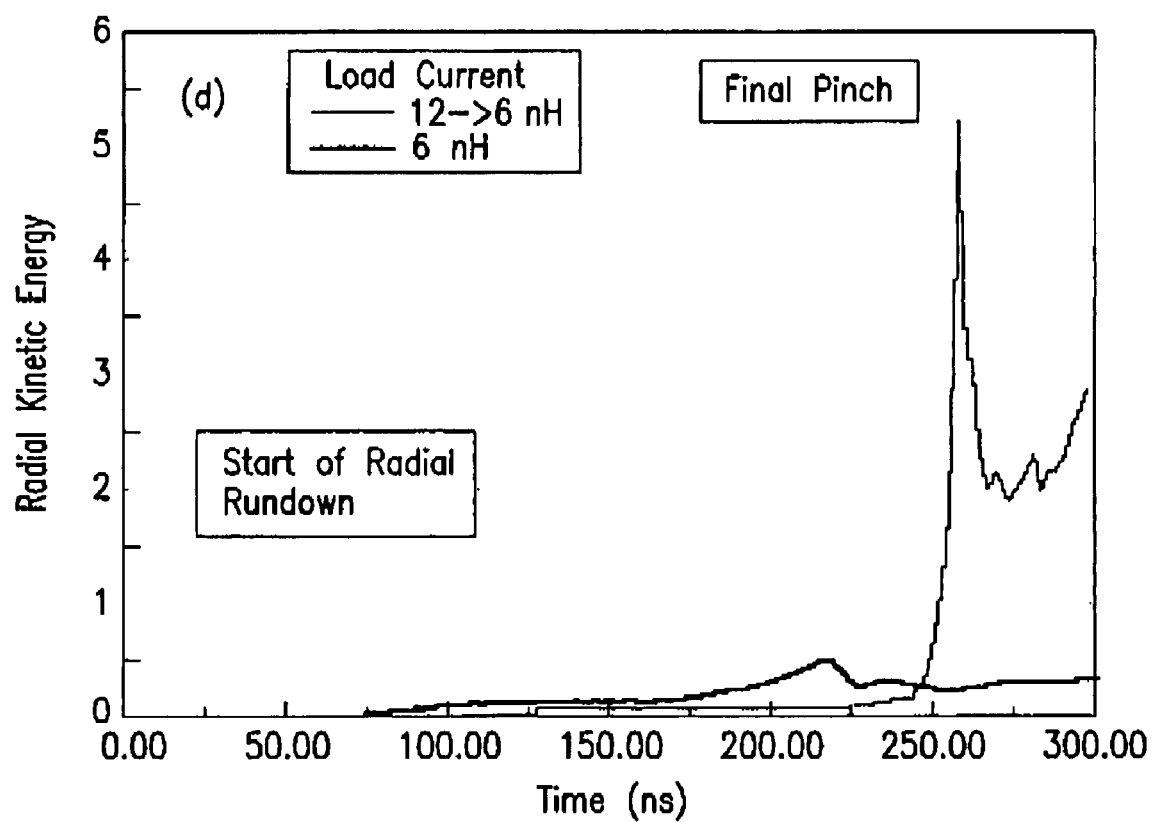

Applicants have simulated this discharge using an electrode geometry somewhat closer to the schematic diagram of FIG. 2, and in addition the simulation was done with He rather than, e.g., Xe. However, the simulation provides enough detail in the simulation to understand the dynamics of the operation of aspects of an embodiment of the invention. In the simulation, e.g., a simulation of the discharge was conducted using the SSPPM currently available in applicants' employers gas discharge laser products, having an inductance for the last stage compression head satuable inductor of 6 nH, which is about as low as can currently be achieved with available materials and geometries, and will give the fastest discharge across the electrode as is possible, i.e., the fastest rise time of the discharge pulse. This simulation is shown in FIG. 18A, with the time scale elongated for illustrative purposes. As can be seen in FIG. 1, in a similar simulation of the use of first a 12 nH inductance and, with the switching on of an additional saturable inductor going relatively rapidly to a 6 nH inductance total, the discharge initially goes to about 20 kAmps and gently rises to about 40 KA, before settling back a few Kamps until the point when the inductance goes to, e.g., 6 nH at which time a rapid spike to about 85 Kamps occurs followed by a drop to 0 in about 20 ns according to the simulation. During the axial rundown phase of the discharge by the peaking capacitor across the electrode, i.e., from about 50 ns to about 240 ns in the simulation of FIG. 18a, the discharge is generally horizontally disposed between the inner surface of the outer electrode 28 and the outer surface of the inner electrode 30. Increasingly angling slightly upwardly along the inner electrode 30 until reaching a region of the inner electrode 30 generally adjacent the lower most extension of the depression at the tip 34 of the inner electrode 30. Therefore acting, e.g., to initiate the discharge, e.g., at 82 and move the discharge, e.g., at 80 towards the electrode 26 tip, and requiring less current to sustain the traveling discharge. During the radial compression phase, e.g., between 240 ns and 260 ns in the simulation of FIG. 18a, when the plasma forms at the tip 34 of the electrode 26, discharge is rapidly increased in current flow to the electrode 26, which, e.g., rapidly transfers significantly increased amounts of kinetic energy to the plasma, e.g., through the rapidly increasing magnetic field confining the plasma, e.g., resulting in a better pinch 32. This is illustrated in a further simulation shown in FIG. 18B. The better pinch has a number of beneficial properties, e.g., keeping the active source gas ions within the pinch longer to, e.g., induce more energy transfer to the ions, e.g., resulting in more x-ray generation from the pinch 32.

This shape of the delivered current can allow, e.g., as much as 3-5 times greater current during the pinch formation, e.g., in the radial rundown, with a concomitant increase in compression, while overall, the electrode dissipates the same amount of energy from the peaking capacitor in the SSPPM, thus also maintaining a thermal energy budget in the electrodes 30, 28 during the entire pulse that is no different that the conventional discharge shown in the simulation of FIG. 18a. The conventional saturable inductor can, e.g., be included in the SSPPM 139 compression head circuit, e.g., having twice the currently conventional saturable inductance, e.g., 12 nH as shown in the simulation of FIG. 18A, and be saturated as usual. An additional saturable inductor, e.g., in parallel with the conventional saturable inductor, to make the parallel inductance smaller, can then be biased to saturate, e.g., as shown in the simulation of FIG. 18A, e.g., rapidly increasing the discharge current at the very end of the discharge, e.g., as shown in the simulation of FIG. 18a. Applicants' simulations of a plasma fluid utilizing simulation software have confirmed the advantages of the proposed driver configuration.

According to another aspect of an embodiment of the present invention, a source gas may be desirable for use, e.g., xenon, e.g., for the generation of EUV light at a particular λ, e.g., 13.5 nm, but also absorb the same light to a high enough degree to interfere with overall light production output. Therefore, applicants contemplate the use of a buffer gas, e.g., argon and helium, that is less absorbent of the produced light at the desired λ, and to, e.g., differentially remove the source gas and the buffer gas from the EUV light production vessel. According to an embodiment of the present invention, a turbopump (not shown) can be configured specifically for the higher molecular weight of a source gas, e.g., xenon, while reducing the pumping capacity with respect to, e.g., argon and helium. This can be accomplished, e.g., by altering the pump operating characteristics, e.g., internal clearances, blade angle and speed, and also, e.g., eliminating the Holweck (molecular drag) stage of the pump. The turbomolecular pump design, therefore, can be set up to exhibit preferential pumping of a higher atomic weight gas (or molecular weight if appropriate), e.g., xenon, over a much lower molecular weight gas, e.g., helium, based, e.g., on molecular velocities.

Figure 15:
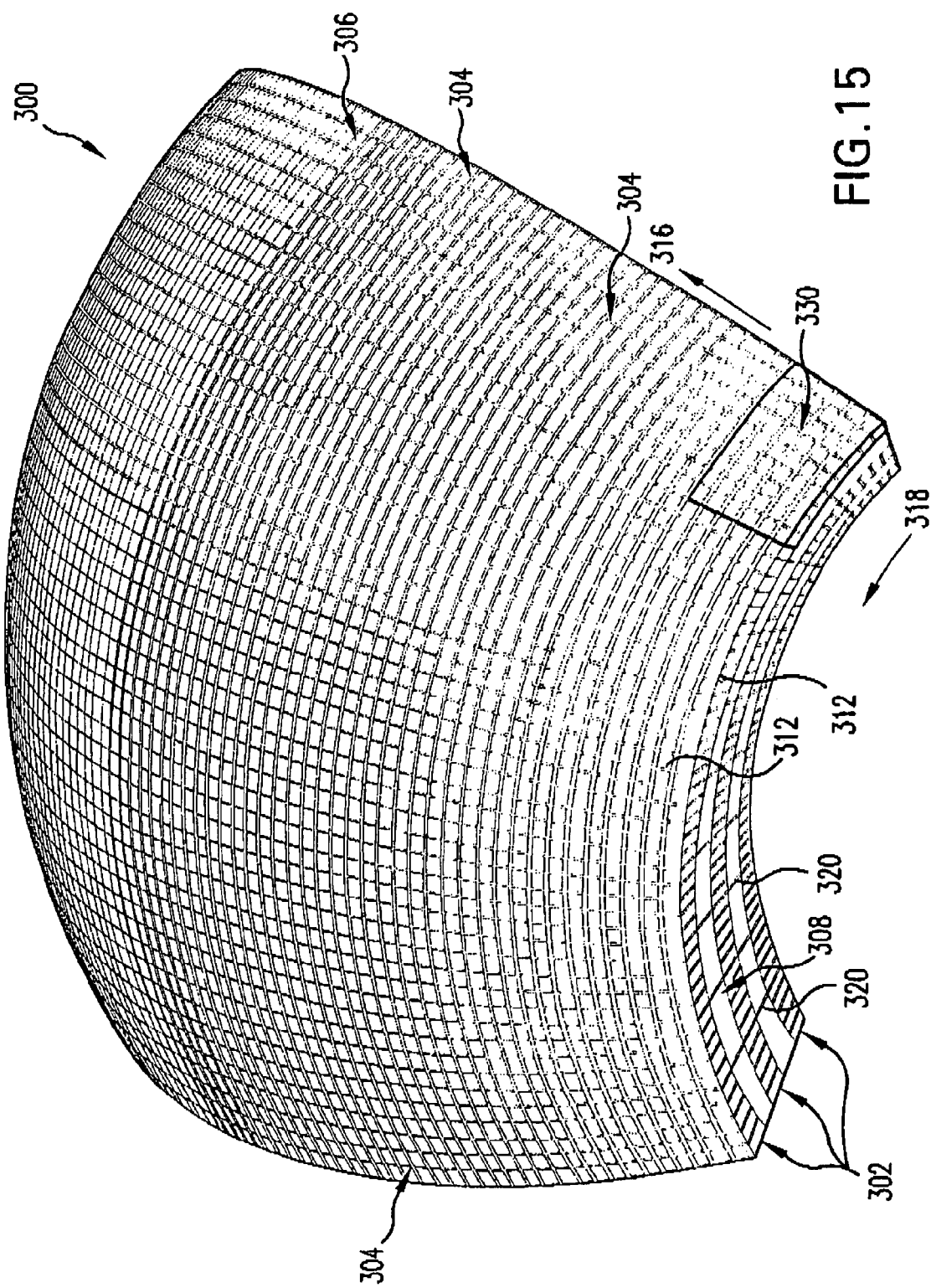
FIG. 15 shows a perspective view of a debris shield according to an embodiment of the present invention.

Turning now to FIG. 15, there is shown a debris shield 300 according to an embodiment of the present invention. Such a debris shield 300 enables simplified fabrication of the debris shield 300 while still achieving the functional solution of preventing debris from the light source reaching the collector mirrors. Simplified fabrication techniques may be employed, according to this embodiment of the present invention, to make the debris shield 300, and at the same time be more cost effective than some other proposed fabrication techniques, e.g., fabricating columnar structures. The fabrication structure and technique also broadens the possible array of materials from which such a simplified fabrication debris shield 300 may be made.

The design of the debris shield 300 according to this embodiment of the present invention can, e.g., be made up of coplanar layers 302 that can, e.g., be arranged to allow the photons to be emitted from the plasma source 32 and pass to the collector 40 as in a columnar structure. The debris would need to navigate through these layers 302 in order to reach the mirror(s) of the collector 40. The number of layers 302 required would be determined by monitoring how much debris is actually able to exit the outer layer of the debris shield 300, formed by an outer surface 306 of the outer-most layer 302, i.e., outer-most from the plasma pinch 32.

As can be seen in FIG. 15, each layer 302 is made up of a plurality of light passages 304 extending between an outer surface 306 of the respective layer 302 and an inner surface 308 of the respective layer 302. The respective curvilinear outer surfaces 306 of each layer 302 may have, e.g., an arc 316, e.g., having a first radius of curvature about a focal point, e.g., at the center of the plasma, which may, e.g., be a fixed point with respect to the electrode 30, where the plasma is controlled to essentially be located for each discharge, of a point that it dynamically determined, e.g., pulse to pulse from the positioning of the actual plasma, e.g., its center of gravity. This arc 316 may be an arc of a circle centered at the focus point. Each respective inner surface 308 may have the same or a similar concentric arc centered at the same focus, except with a smaller radius of curvature, depending upon the thickness of the layer 302. The surfaces are co-planar in the sense that the curvatures about the two axes of rotation can, e.g., remain the same throughout the structure, i.e., from outer surface of a layer to inner surface of a layer to outer surface of the next layer disposed toward the pinch 32.

The outer surface 306 of each respective layer 302 may have, e.g., an arc 318, e.g., forming an ellipse centered on a first focal point, which may coincide the center of the circle formed by the arc 316, or of a concentric circle with the center of the circle forming the arc 316. This may be determined, e.g., by the shape of the collector mirror(s) being utilized for the collector 40.

Each of the light passages 304 may be uniform in shape between the outer surface 306 and the inner surface 308 in each respective layer 302, or tapered toward one or both of the centers of the shapes comprising arcs 316 and 318.

The layers may be formed of, e.g. a metal, e.g., titanium or tungsten, a ceramic or refractory metal, e.g. $SiO_2$, Alumina $AlO_2$ or Titania, $TiO_2$, or other ceramic metal combinations.

According to another aspect of this embodiment of the present invention, there may be gaps between each layer 302, as shown in FIG. 15. The respective layers 302 may, e.g., be attached to each other by, e.g., connector posts 320, which may correspond to each of the four corners of the light passages 304 throughout the interface space between the respective layers, or periodically spaced connector posts 320, as shown in FIG. 15. Also as shown in FIG. 15, the layers 302 may be divided into sections, e.g., either of the entire size shown in FIG. 15 or sub-sections such as section 330 shown in FIG. 15. In this fashion, e.g., an entire solid of rotation can be fabricated to fit all around or substantially all around the plasma pinch focus 32.

Potentially the debris could fall to the bottom of the shield 300 rather than build up in the holes of the proposed design. Debris removal could, e.g., be an added feature, e.g., allowing longer intervals between replacements.

It will also be understood that the debris shield 300 may be formed, e.g., with the openings 304 formed only of opposing side walls along one of the arcs 316 or 318, e.g., either in each layer 302 or in the openings between adjacent layers 302, if there are such openings. That is, the passages 304 need not have four walls 312, which may still provide enough debris trapping and be structurally sound, but, e.g., facilitate fabrication and/or facilitate the debris shield 300 having one arc 2=316, 318 that is a part of a circle and the other that is, e.g., part of an ellipse.

Figure 16:
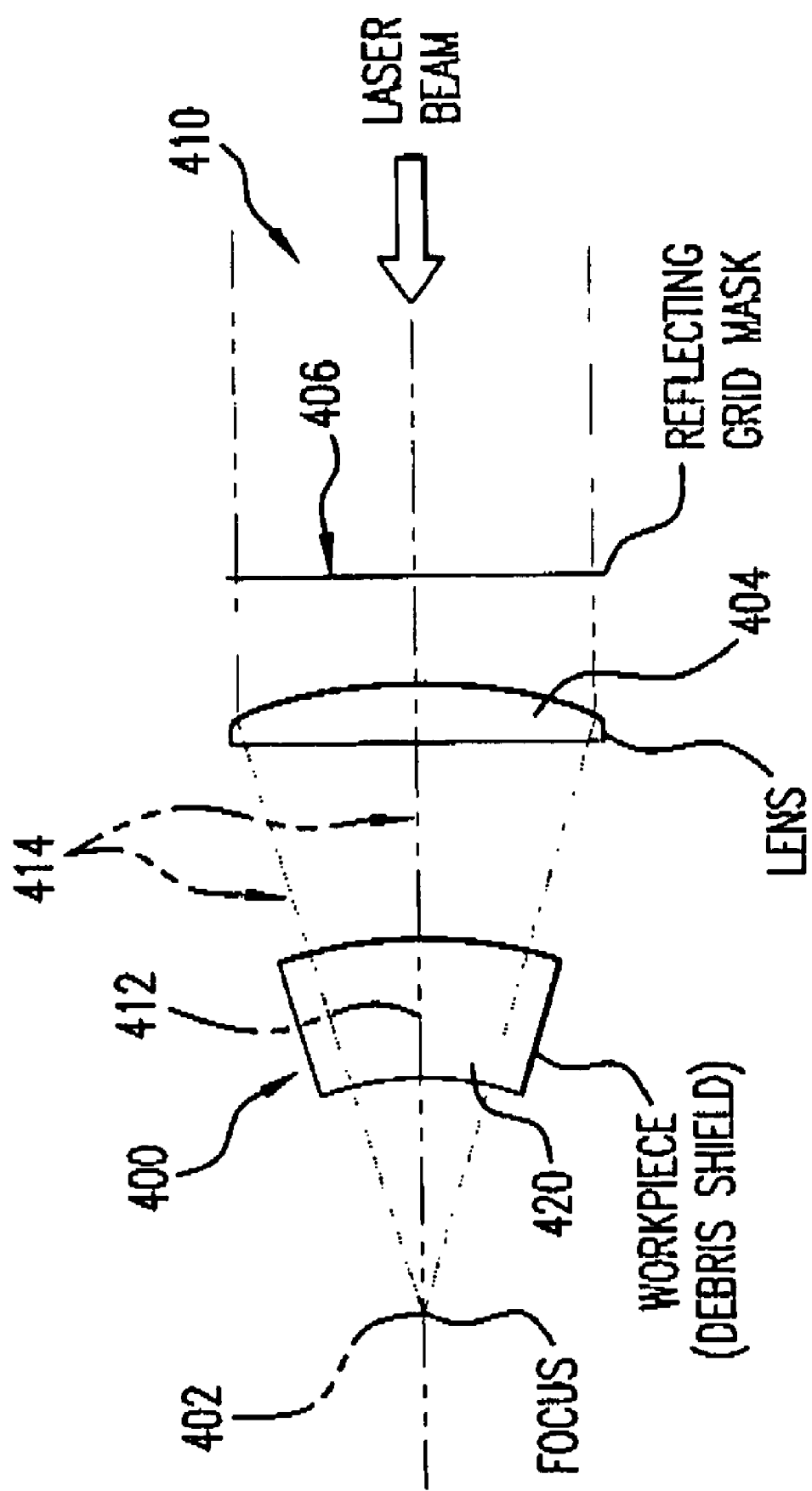
FIG. 16 shows a schematic view of a process for making a debris shield according to an embodiment of the present invention.

Turning now to FIG. 16, there is shown another embodiment of the present invention regarding the fabrication and structure of a debris shield 400. FIG. 16 shows an example of an "Out-of-focus laser machining" technique useful, e.g., for producing DPP or other EUV debris shields, e.g., with light transmission passages focused to a focal point, or other applications for tapered array structures with a common focus.

Such a debris shield 400 may, e.g., require tapered channels pointing to a common focus 402. Laser machining can, e.g., be carried out with sufficiently high laser intensity utilizing an unfocused laser beam. Accordingly, applicants have discovered that the correct shape for a debris shield and its light passages may, e.g., be made by using a focusing lens 404 behind a grid-like mask 406. In the arrangement of FIG. 18, e.g., high enough laser power and suitably short laser wavelength to do the laser machining out-of-focus may be provided, e.g. utilizing applicants' assignee's XLA dual chambered MOPA configured lasers. The general set-up is shown in FIG. 16 can include, e.g., a parallel laser beam 410 (which need not necessarily be wholly parallel), which can be, e.g., incident from the right as shown in FIG. 18. The laser beam 410 can, e.g., first be incident on the mask 406, which can be a grid or mesh, e.g., in order to make square or circular channels 412. The mask, which may be made of, e.g., W or Mo, can, e.g., be coated on the side facing the laser beam 410 with a reflective coating, e.g., a thin film of, e.g., aluminum to enhance the reflectivity and avoid degradation of the mask 406 by the laser beam 410. The mask 406 can also, e.g., be tilted very slightly to avoid back-reflection into the laser amplifier/oscillator. Also, if the mesh (not shown) is made from wires with round cross section, the back-reflection problem can be reduced. The lens 404, or, more generally, the focusing optic, can, e.g., generate an array of convergent beamlets 414 that already have the required taper.

A work-piece 420, which may be, e.g., a section of a spherical solid, constructed and positioned to have a center at the focus 402, can be placed at the correct distance between the lens 404 and the laser focus 402. Even if the laser beam 410, e.g., is not be intense enough to machine the entire debris shield 400 at once, e.g., a focused laser beam, e.g., scanned, e.g., across the mask 406 can have the desired effect. The entire set-up, i.e., mask 406, lens 404 and work-piece 420, may, e.g., be moved laterally, perpendicularly as shown in FIG. 16 in front of the laser beam 410, and the channels, e.g., can then be machined consecutively. Scanning over the entire surface of the workpiece may be, e.g., controlled to be faster than the channel 412 drilling, such that, e.g., no additional stresses are induced in parts of the workpiece by partially finished drilling. To make the scanning reproducible, it could, e.g., be motorized and/or controlled by piezoelectric actuators that can, e.g., drive the lateral motion of the entire setup 404, 406 and 420 with respect to the laser beam. Alternatively, the laser beam may be scanned across the lens 404 by means of actuator-controlled deflection optics (not shown) that can, e.g., conserves the direction of incidence of the laser beam and the laser focus position. The laser beam 410 intensity can be controlled to be high enough so that that it will ablate the workpiece, even out-of-focus but at the same time not damage the lens 404 and reflecting mask 406. Therefore, in most cases, e.g., a short (ultraviolet) wavelength of the laser beam 410 would be best suited. Applicants believe that it is better to put the mask 406 in front of the lens 404, e.g., as shown in FIG. 16, e.g., in order to avoid laser-sputtered material from the mask 406 being incident on the lens and damaging the lens. The sputtered material most often is emitted toward the direction from which the laser light is incident. Another option, e.g., to increase the laser intensity at the workpiece 420 may be, e.g., to go to femtosecond laser machining, e.g., using a Ti:sapphire laser at 745 nm or 772 nm, e.g., with subsequent frequency tripling or quadrupling, respectively, and then amplifying this pulse, e.g., using a KrF or ArF excimer gas discharge laser amplifier.

According to another aspect of an embodiment of the present invention, debris removal may be effected using an electrochemical reaction. Applicants contemplate taking advantage of the fact that tungsten reacts directly with fluorine, $F_2$, or a molecule containing fluorine, e.g., $NF_3$, at room temperature to form tungsten fluoride, $WF_6$. Excess Tungsten atoms, e.g., from a tungsten electrode 30, according to an embodiment of the present invention can be removed from the source output, e.g., by combining the source output with a halogen gas such as fluorine or chlorine to form, e.g. a metal halide. As an example, a volatile gas may, e.g., be formed by reaction of undesired debris particles, e.g., tungsten atoms, ions and clusters, in the presence of, e.g., reactive halogen gases forming molecules like $WF_6$ or $WCl_6$. In strong contrast to the pure tungsten particles that have a high sticking probability on solid surfaces (like collector optics) these molecular compounds have a very low sticking probability on solid surfaces and are thus preferentially pumped away and removed from the vessel. This volatile gas, e.g., inserted into the output light emitted from the EUV plasma source thus can, e.g., provide an environment where increased atomic collisions may occur between the undesirable Tungsten atoms and the "scrubber" halogen gas. This could then cause, e.g., the Tungsten atoms to combine with the gas(es) to form a compound such as Tungsten Fluoride ($WF_6$) or Tungsten Chloride ($WCl_6$) and to be removed from the vessel.

According to another aspect of an embodiment of the present invention, electrode lifetime can be increased and/or replacement costs can be decreased in a variety of different ways. The inner electrode 30 could be, e.g., made to be screwed by including threaded connections on the electrode outer wall and on the anode assembly 220. The electrode 30 could be made to be continuously fed, e.g., by external means, e.g., a fitting extending through the wall of the vessel 22, which could be threaded both for movement of the electrode as it wears over time and to provide a tortuous path for pressure sealing of the vessel. The electrode, 30 could be mounted on a sleeve that is so threaded. The electrode 30 could be replaced with a plurality of electrodes, e.g., arranged in an array and either fired to share the discharge pulses or filed, e.g., seriatim, or left unfired for a time and then placed into the discharge circuit. The shape of the electrode 30 could be selected to foster longer life. Thermoelectric cooling could be substituted for water cooling.

Turning now to FIGS. 17A-H there is shown another debris shield according to an embodiment of the present invention. FIG. 17A shows a perspective view of a debris shield 450 according to aspects of an embodiment f the present invention. The debris shield 450 may comprise a mounting ring 452 having an opening defining a collection aperture, e.g., extending over a portion of a spherical surface of light expanding from a plasma source at a focus and covering, e.g., approximately 1-2 steradians. In the center of the opening may be a hub 454, having side walls containing slots 455 and, e.g., tapering toward the focus. The mounting ring 452 may also have slots 453 (shown in FIG. 17C).

A plurality of thin, e.g., about 0.25 cm thick long fins 456 may be engagingly mounted to the slots 455 and/or 453, respectively in the mounting ring 452 or the hub 454. It will be understood, that slots may only be needed in one or the other of the mounting ring 452 and hub 454 and/or that the slots may be a plurality of short sots, ass opposed to those shown in, e.g., FIGS. 17a and 17D extending the length of the hub 454, and may, e.g. be keyed to certain long fins 456, e.g., for particular positioning around the hub 454, i.e., each long fin 456 may have a particular slot or slots vertically displaced along a radius of the outer surface of the hub 454 tapered portion into which a particular long fin 456 and only that long fin 456 can engage. The same may be true for slots 453 on the mounting ring 452.

Intermediate the long fins 456, forming, according to an aspect of an embodiment of the present invention, e.g., a grouping of, e.g., five fins, comprised of, e.g., two long fins 456, an intermediate fin 458, e.g., between the adjacent two long fins 456, and two short fins 470, each intermediate the intermediate fin 458 and adjacent long fins 456.

As shown in more detail in FIG. 17E, the long fins 456 may have an intermediate fin tab receiving slot 457 and a short fin tab receiving slot 459. In turn, the intermediate fins, as shown in FIG. 17F may have a long tab 460, which can, e.g., engage a respective intermediate tab receiving slot 457 on an adjacent long fin 456. Also, e.g., there may be mounted, e.g., intermediate the intermediate fin 458 and adjacent long fins 456 a pair of short fins 470. Each short fin 470 may have, e.g., a short fin tab, which may, e.g., engagingly fit into a respective short fin tab receiving slot 459 in a respective adjacent long fin 456. Each of the intermediate fins 458 and short fins 470 may also have, e.g., separator/strengthening fins, respectively 460a, 472a that, may, e.g., rest against adjacent respective intermediate fins 458 or long fns 454, as the case may be. It will be seen that the tabs 460, 460a, 472, 472a can, e.g., extend along the radius to the focus of the debris shield, e.g., at the center of the plasma pinch 32, so as to not block any significant amount f the light emitting from the pinch 32 and passing through the debris shield 450. As can be seen in the top view of FIG. 17 B, the tabs 460, 460a, 472, 472a are visible extending along respective radii to the focus.

The debris shield 450 may have a mounting ring top locking ring 484 and a mounting ring bottom locking ring 488 respectively held in place on the mounting ring by screws 486 and 490, e.g., to hold the mounting ting facing sides of the respective fins 454, 456 and 470 to the mounting ring 452, regardless f whether or not slots 453 exist on the mounting ring 452. Similarly, the hub 454 may have a top locking plate 480, which may be held in place, e.g., by a locking plate nut 482 and a bottom locking nut 483.

It will be understood that in operation the thin, e.g., 0.25 cm thick fins 456, 458, 470 can serve to collect debris plating onto the surfaces of the fins 56, 458, 470, and the interlocking tabs 460, 472 and separator tabs 460a, 472a can strengthen and uniformly separate the fins 456, 458 and 470 in the groups of the structure and prevent warping, e.g., due to thermal exposure of the debris shield 450.

According to another aspect of an embodiment of the present invention there is known that metallic compounds may be used as a source for a discharge produced plasma, and that powdered forms of such a metallic compound, e.g., tin may be a reliable method of delivering the source for formation of the plasma. However, reliable methods of delivering the right quantities of such material. Applicants have discovered such a method. According to an aspect of an embodiment of the present invention applicants propose to provide particles of metal in the form, e.g. of a powder with the particles generally, e.g., as small as possible, e.g., on the order of 1μ in diameter. By puffing the powdered compound, e.g., tin, into a gas feedstock used in a pulse plasma discharge, the powder can be delivered to the plasma formation site. The feedstock, i.e., carrier, gas may be, e.g., a benign gas, e.g., neon, e.g., serving solely as a carrier, or, e.g., may be an active gas, e.g., xenon, which could also assist in the formation of the plasma, and/or in initiation of the breakdown of the plasma discharge. The method of, e.g., atomizing the, e.g., tin into the feedstock may, e.g., include a method in which the feedstock gas passes through or over a quantity of the powdered metal, e.g., tin, which may be, e.g., agitated, e.g., shaken up, e.g., with a piezoelectric actuator, e.g., sufficiently to cause fine particles of the metal o become airborne in the feedstock gas stream, which may then be directed, e.g., through a hollow anode, to the plasma formation site.

It will be understood that in this fashion a precision metered amount of the powdered material may be inserted into the feedstock gas flow, e.g., a certain density pre unit time, and this amount may be modulated, as desired, e.g., by modulating the amount of agitation, e.g., by modulating the voltage applied to the piezoelectric actuator. It will also be understood, that control may also be exercised by modifying the feedstock gas flow rate past the agitated powdered material. Modulation may be effected to, e.g, limit debris formation in the plasma. Modulation may also be effected, e.g., by periodically interrupting flow of the feedstock gas, e.g., also by periodically injecting a pure feedstock gas flow, e.g., without any inserted material, e.g., with a cross-flow geometry. Also, e.g., if larger particles are used, debris mitigation may be effected using, e.g., a mesh whose holes prevent passage within the feedstock gas of particles above a certain selected size.

The above described embodiments of the present invention are not to be considered the only embodiments of the inventions disclosed in the present application and the embodiments are subject to many changes and modifications that will be understood by those skilled in the art and their equivalents and still remain within the scope of the appended claims, which alone should be considered to define the scope of the inventions as claimed.

We claim:

1. A discharge produced plasma EUV light source comprising:

a collector comprising a plurality of nested shell members arranged in relation to a plasma pinch location to form grazing angle of incidence reflectors of EUV light emitted from the plasma pinch; and a temperature control mechanism operatively connected to the collector and operative to regulate the temperature of the respective shell members to maintain a temperature related geometry optimizing the glancing angle of incidence reflections from the respective shell members.

2. The apparatus of claim 1 further comprising:

the temperature control mechanism comprises a heater.

3. The apparatus of claim 2 further comprising:

each nested shell member comprising:

a first grazing angle of incidence reflector element collecting the EUV light emitted from the plasma pinch; and a second grazing angle of incidence reflector clement collecting EUV light emitted from the first grazing angle of incidence reflector element.

4. The apparatus of claim 1 further comprising:

the temperature control mechanism comprises a heat remover.

5. The apparatus of claim 4 further comprising:

each nested shell member comprising:

a first grazing angle of incidence reflector element collecting the EUV light emitted from the plasma pinch; and a second grazing angle of incidence reflector element collecting the EUV light emitted from the first grazing angle of incidence reflector element.

6. The apparatus of claim 1 further comprising:
each nested shell member comprising:
a first grazing angle of incidence reflector element collecting the EUV light emitted from the plasma pinch; and
a second grazing angle of incidence reflector element collecting the EUV light emitted from the first grazing angle of incidence reflector element.

* * * * *

UNITED STATES PATENT AND TRADEMARK OFFICE
CERTIFICATE OF CORRECTION

PATENT NO. : 7,291,853 B2  Page 1 of 1
APPLICATION NO. : 11/493945
DATED : November 6, 2007
INVENTOR(S) : Fomenkov et al.

It is certified that error appears in the above-identified patent and that said Letters Patent is hereby corrected as shown below:

On the title of the patent, please correct the following:

(75) Inventors: change "Nortbert" to --Norbert--.
(75) Inventors: change "Wataupok" to --Whataupoko--.

Column 11:
Line 33, after "subsidiary", change "Schwartzkopf" to --Schwarzkopf--.

Signed and Sealed this

Third Day of June, 2008

JON W. DUDAS
*Director of the United States Patent and Trademark Office*